United States Patent
Xie et al.

(10) Patent No.: US 11,916,143 B2
(45) Date of Patent: Feb. 27, 2024

(54) VERTICAL TRANSPORT FIELD-EFFECT TRANSISTOR WITH GATE PATTERNING

(71) Applicant: INTERNATIONAL BUSINESS MACHINES CORPORATION, Armonk, NY (US)

(72) Inventors: Ruilong Xie, Niskayuna, NY (US); Wenyu Xu, Albany, NY (US); Indira Seshadri, Niskayuna, NY (US); Jing Guo, Niskayuna, NY (US); Ekmini Anuja De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 17/448,777

(22) Filed: Sep. 24, 2021

(65) Prior Publication Data

US 2023/0101011 A1  Mar. 30, 2023

(51) Int. Cl.
*H01L 29/78* (2006.01)
*H01L 21/8238* (2006.01)
*H01L 29/40* (2006.01)
*H01L 29/66* (2006.01)
*H01L 27/092* (2006.01)

(52) U.S. Cl.
CPC .. *H01L 29/7827* (2013.01); *H01L 21/823885* (2013.01); *H01L 27/092* (2013.01); *H01L 29/401* (2013.01); *H01L 29/66666* (2013.01)

(58) Field of Classification Search
CPC ......... H01L 29/7827; H01L 21/823885; H01L 27/092; H01L 29/401; H01L 29/66666; H01L 29/78642

USPC ........................................................ 257/329
See application file for complete search history.

(56) References Cited

U.S. PATENT DOCUMENTS

| | | |
|---|---|---|
| 7,211,864 B2 | 5/2007 | Seliskar |
| 7,300,837 B2 | 11/2007 | Chen |
| 7,719,058 B2 | 5/2010 | Seliskar |
| 8,120,103 B2 | 2/2012 | Hong |
| 8,153,499 B2 | 4/2012 | Or-Bach |
| 8,378,494 B2 | 2/2013 | Or-Bach |
| 8,709,880 B2 | 4/2014 | Or-Bach |
| 9,202,894 B1 | 12/2015 | Zang |
| 9,515,185 B2 | 12/2016 | Liu |
| 9,614,087 B1 | 4/2017 | Cheng |
| 9,755,073 B1 | 9/2017 | Cheng |
| 9,799,765 B1 | 10/2017 | Bergendahl |
| 10,249,538 B1 | 4/2019 | Qi |
| 2018/0005834 A1 | 1/2018 | Cheng |
| 2018/0151561 A1* | 5/2018 | Cantoro .......... H01L 21/823412 |
| 2018/0358269 A1* | 12/2018 | Bao ................. H01L 21/823418 |

* cited by examiner

*Primary Examiner* — Mohammad M Hoque
(74) *Attorney, Agent, or Firm* — Jeffrey M. Ingalls

(57) ABSTRACT

A semiconductor device is provided. The semiconductor device includes a bottom epitaxial layer, a gate stack formed over the bottom epitaxial layer, the gate stack including a work function metal (WFM) layer, a channel fin formed on the bottom epitaxial layer, a first interlayer dielectric (ILD) layer formed in a gate landing area over the gate stack, a second ILD layer formed in an area other than the gate landing area, and a WFM encapsulation layer formed between the first ILD layer and the second ILD layer, and formed on sidewalls of the gate stack.

10 Claims, 28 Drawing Sheets

VERTICAL TRANSPORT FIELD-EFFECT TRANSISTOR WITH GATE PATTERNING

BACKGROUND

The present disclosure relates to semiconductor devices. In particular, the present disclosure relates to fabrication methods and resulting gate patterning structures for vertical transport field-effect transistors (VTFETs).

Fin field-effect transistor (FinFET) devices include a transistor architecture that uses raised source-to-drain channel regions, referred to as fins. Known FinFET devices include fins with source/drain regions on lateral sides of the fins so that current flows in a horizontal direction (e.g., parallel to a substrate) between source/drain regions at opposite ends of the fins in the horizontal direction. As horizontal devices are scaled-down, there is reduced space for metal gates and source/drain contacts.

VTFETs are becoming viable device options for smaller-scale semiconductor devices, such as, for example, devices beyond the 7 nanometer (nm) node. VTFET devices include fin channels with source/drain regions at the ends of the fin channels on the top and bottom sides of the fins. Current runs through the fin channels in a vertical direction (e.g., perpendicular to a substrate), for example, from a bottom source/drain region to a top source/drain region.

Vertical transport architecture devices are designed to address the limitations of horizontal device architectures by, for example, decoupling gate length from the contact gate pitch, providing a FinFET-equivalent density at a larger contacted poly pitch (CPP), and providing lower MOL resistance.

VTFET devices provide viable solutions for transistor scaling. With current flowing in the vertical direction, the gate length and source/drain dimension are not limited by the lateral scaling. As the scale of VTFET devices becomes increasingly smaller, a topic of interest may relate to minimizing or preventing electrical shorting between adjacent devices.

SUMMARY

Embodiments of the present disclosure relate to a semiconductor device. The semiconductor device includes a vertical transport field-effect transistor (VTFET) device. The semiconductor device includes a bottom epitaxial layer, a gate stack formed over the bottom epitaxial layer, the gate stack including a work function metal (WFM) layer, a channel fin formed on the bottom epitaxial layer, a first interlayer dielectric (ILD) layer formed in a gate landing area over the gate stack, a second ILD layer formed in an area other than the gate landing area, and a WFM encapsulation layer formed between the first ILD layer and the second ILD layer, and formed on sidewalls of the gate stack.

Other embodiments relate to a method of fabricating a semiconductor device. The method includes forming a bottom epitaxial layer; forming a gate stack over the bottom epitaxial layer, the gate stack including a work function metal (WFM) layer; forming a channel fin on the bottom epitaxial layer, forming an organic planarization layer (OPL) on the gate stack; forming an opening in the OPL in a gate landing region of the gate stack; forming a first interlayer dielectric (ILD) layer in the opening on the gate stack; removing the OPL; forming a WFM encapsulation layer on sidewalls of the first ILD layer and sidewalls of the gate stack; and forming a second ILD layer such that the WFM encapsulation layer is between the first ILD layer and the second ILD layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1A:
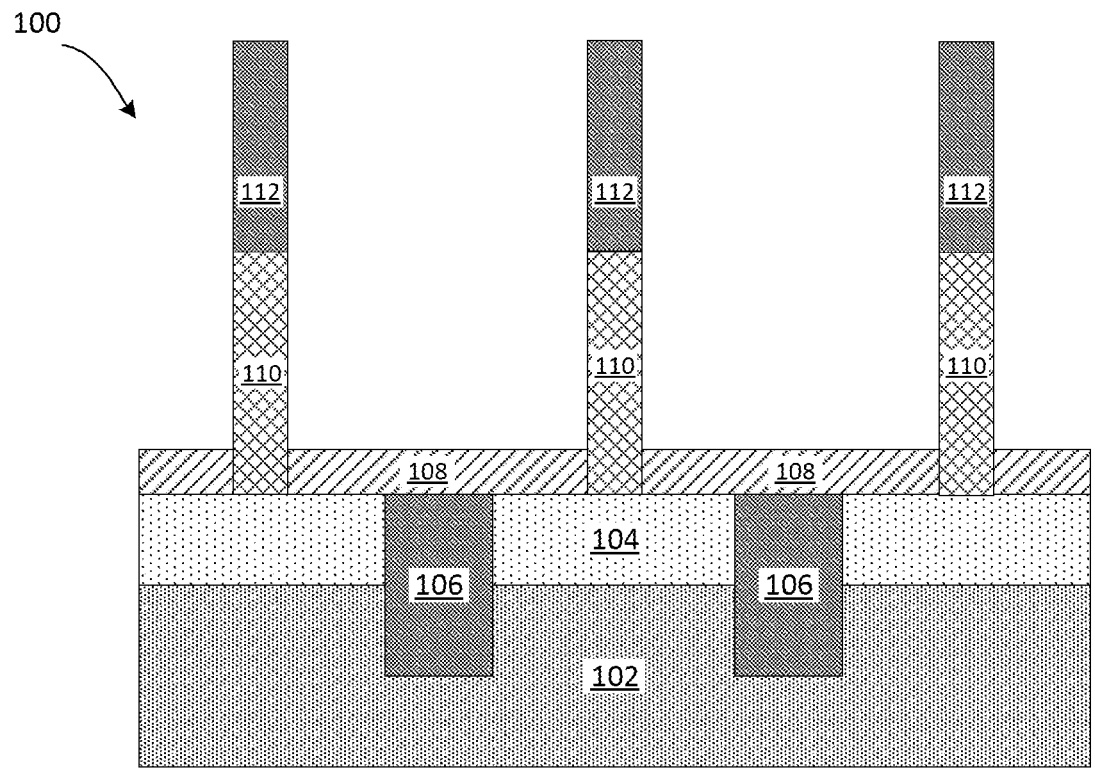
FIG. 1A is a cross-sectional view of a VTFET semiconductor device at an intermediate stage of the manufacturing process and taken along the line X1-X1' of FIG. 1B, according to embodiments.

Exemplary embodiments will now be discussed in further detail with regard to semiconductor devices and methods of manufacturing same and, in particular, to VTFET devices where a gate patterning structure is provided that may reduce an occurrence of pattern collapse.

It is to be understood that the various layers and/or regions shown in the accompanying drawings are not drawn to scale and that one or more layers and/or regions of a type commonly used in, for example, FinFET, VTFET, CMOS, field-effect transistor (FET), nanowire FET, nanosheet FETs, metal-oxide-semiconductor field-effect transistor (MOSFET), single-electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming the same in accordance with embodiments of the present embodiments can be employed in applications, hardware, and/or electronic systems. Suitable hardware and systems for implementing embodiments may include, but are not limited to, personal computers, communication networks, electronic commerce systems, portable communications devices (e.g., cell and smartphones), solid-state media storage devices, functional circuitry, etc. Systems and hardware incorporating the semiconductor devices are contemplated embodiments. Given the teachings of the embodiments provided herein, one of ordinary skill in the art will be able to contemplate other implementations and applications of the embodiments.

The present embodiments may be used in connection with semiconductor devices that may require, for example, FinFETs, VTFETs, CMOSs, FETs, nanowire FETs, nanosheet FETs, SETs, and/or MOSFETs. By way of non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin," or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin", or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating, or semiconductor layers at the interface of the two elements. It should be noted, the term "selective to," such as, for example, "a first element selective to a second element," means that a first element can be etched, and the second element can act as an etch stop.

For the sake of brevity, conventional techniques related to a semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known, and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

A deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE"), and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE, the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photoresist. To build the complex structures that make up a transistor and the many wires that connect the millions of transistors of a circuit, lithography and etch pattern transfer steps are repeated multiple times. Each pattern is printed on the wafer is aligned to the previously formed patterns, and slowly the conductors, insulators, and selectively doped regions are built up to form the final device.

Turning now to an overview of memory technologies that are more specifically relevant to aspects of the present disclosure, in certain VTFET devices, the reduced pitch of the devices becomes quite small, and the aspect ratio of the device components become so high that there may be the potential for pattern collapse between the pillar components of adjacent VTFET devices. In general, pattern collapse is a damaging phenomenon during the production of microelectronic devices. High aspect ratio structures like shallow trench isolation, capacitor-over bit line, and the pillar structures of VTFET devices may be particularly vulnerable to pattern collapse. The damage may have a distinctive shape, where the tops of the structures are connected together with their neighbors either by rupture or bending. In certain examples, this issue may be attributed to surface tension forces during a drying step of a wet clean process. However, other influences such as the chemical reactivity of the nanoscale structures may also be a factor. It may be desirable to reduce or eliminate the occurrence of pattern collapse in VTFET structures (e.g., in the organic planarization layer (OPL) of the VTFET pillars).

Figure 1B:
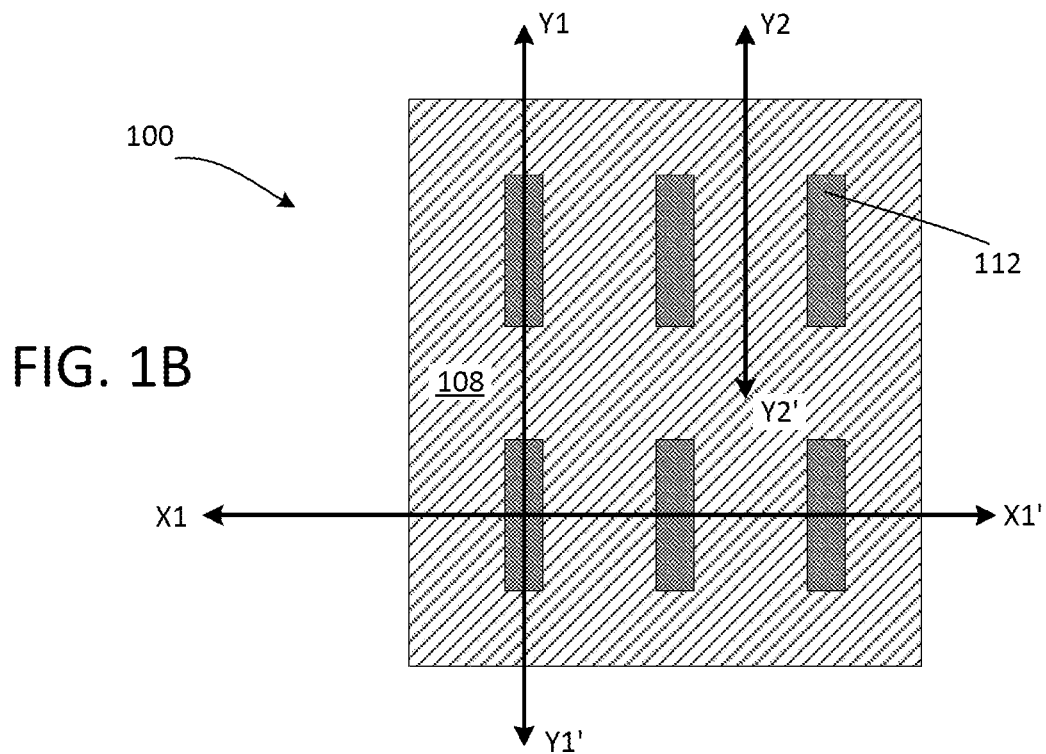
FIG. 1B is a top down view of the VTFET semiconductor device of FIG. 1A, according to embodiments.

Referring now to the drawings in which like numerals represent the same or similar elements and initially to FIG. 1A, an exemplary method of manufacturing a semiconductor device 100 that is a VTFET device at an intermediate stage of the fabrication process is shown, according to embodiments. As shown in FIG. 1A, which is taken along the line X1-X1' of FIG. 1B, a substrate 102 is provided. The substrate 102 may include a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or another like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide. As shown in FIGS. 1A and 1D, after depositing a hardmask material 112 over the substrate 102, fins 110 are patterned. The fin 110 patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin 110 patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments describe channel regions as fins, the embodiments are not necessarily limited to fin channel regions, and may include nanowire channel regions. In addition, although six fins 110 are shown in the figures for ease of explanation, more or less than six fins can be formed. After fins 110 are formed, a sacrificial protecting liner (not shown) can be formed over the fins 110 and the fin hardmask 112 sidewalls to prevent subsequent bottom S/D epi growth from the fin 110 sidewalls. Additional Si recess and lateral Si undercut etch (not shown) can be done to create the bottom source/drain cavities for bottom source/drain epi growth As shown in FIG. 1A and FIG. 1D (which is taken along the line Y1-Y1' of FIG. 1B), a bottom epitaxial layer 104 (i.e., bottom source/drain (S/D) epi) is epitaxially formed on the substrate 102. According to an embodiment, the bottom epitaxial layer 104 (or bottom source/drain regions) includes, if it is a pFET boron doped SiGe or Si (less preferred), or if it is an nFET phosphorus or arsenic doped silicon. However, it should be appreciated that other suitable materials may be used for the bottom epitaxial layer 104.

Terms such as "epitaxial growth and/or deposition" and "epitaxially formed and/or grown" refer to the growth of a semiconductor material on a deposition surface of semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 400° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon-containing gas source, a germanium-containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane, and combinations thereof. While an epitaxial silicon germanium alloy layer can be formed utilizing a combination of such gas sources. Carrier gases like hydrogen, helium, and argon can be used.

Figure 1C:
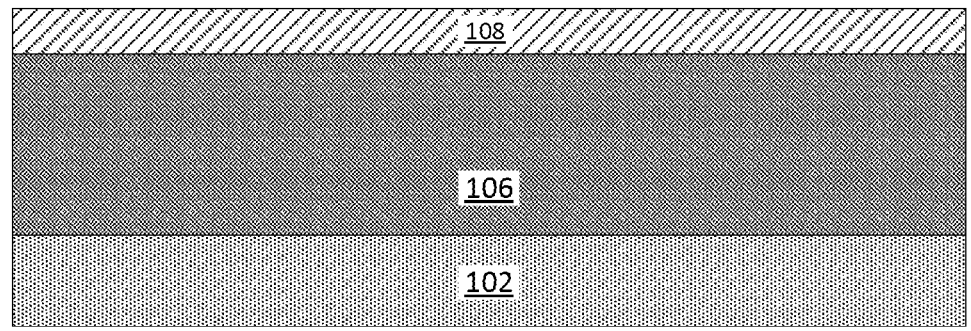
FIG. 1C is a cross-sectional view of the VTFET semiconductor device of FIG. 1A taken along the line Y2-Y2' of FIG. 1B, according to embodiments.
Figure 1D:
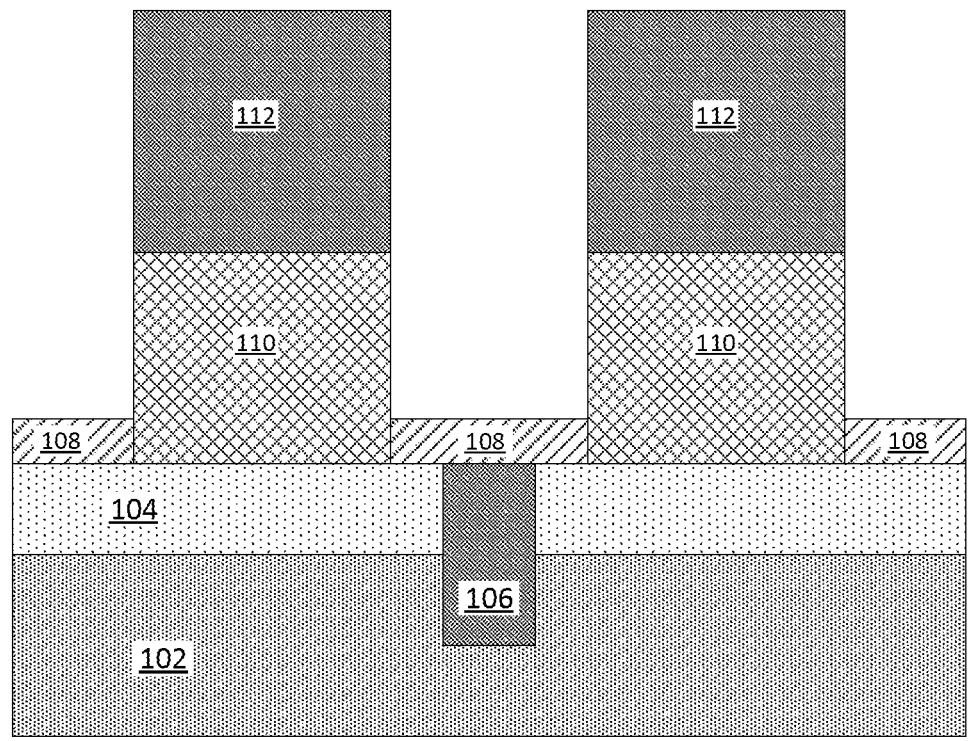
FIG. 1D is a cross-sectional view of the VTFET semiconductor device of FIG. 1A taken along the line Y1-Y1' of FIG. 1B, according to embodiments.

As shown in FIG. 1A, FIG. 1C (which is taken along line Y2-Y2' of FIG. 1B) and FIG. 1D, in certain embodiments, the semiconductor device 100 also includes isolation regions 106 (e.g., shallow trench isolation (STI) regions) formed between bottom source/drain epis from different devices. The isolation trenches are firstly being patterned by a litho and etch process to etch away unwanted bottom source/drain epis. After that, dielectric is filled in the STI region. The isolation regions 106 include dielectric material, such as, but not necessarily limited to, $SiO_x$, SiOC, SiOCN or some other suitable dielectric material. Shallow trench isolation (STI), also known as box isolation technique, is an integrated circuit feature that prevents electric current leakage between adjacent semiconductor device components. STI is generally used on complementary metal-oxide-semiconductor (CMOS) process technology nodes of 250 nanometers and smaller. In general, STI regions are created early during the semiconductor device fabrication process before transistors are formed. The key steps of the STI process involve etching a pattern of trenches in the silicon, depositing one or more dielectric materials (such as silicon dioxide) to fill the trenches, and removing the excess dielectric using a technique such as chemical-mechanical planarization and selective dielectric recess by wet or dry etch.

As shown in FIGS. 1A, 1C and 1D, a bottom spacer layer 108 is formed on the bottom epitaxial layer 104 for the NFET and PFET regions. The bottom spacer layer 108 may include, but is not necessarily limited to, silicon boron nitride (SiBN), siliconborocarbonitride (SiBCN), silicon oxycarbonitride (SiOCN), silicon nitride (SiN) or silicon oxide ($SiO_x$), where x is, for example, 2 in the case of silicon dioxide ($SiO_2$), or 1.99 or 2.01. According to an embodiment, the bottom spacer layer 108 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Alternatively, the spacer material can be overfilled, followed by CMP and dielectric recess processes.

It should be appreciated that the order in which the layers are formed may not be the same as the order in which the layers are presented above. For example, the bottom spacer layer 108 may be formed after the formation of the fins 110 and fin hardmask 112, in certain embodiments.

Figure 2A:
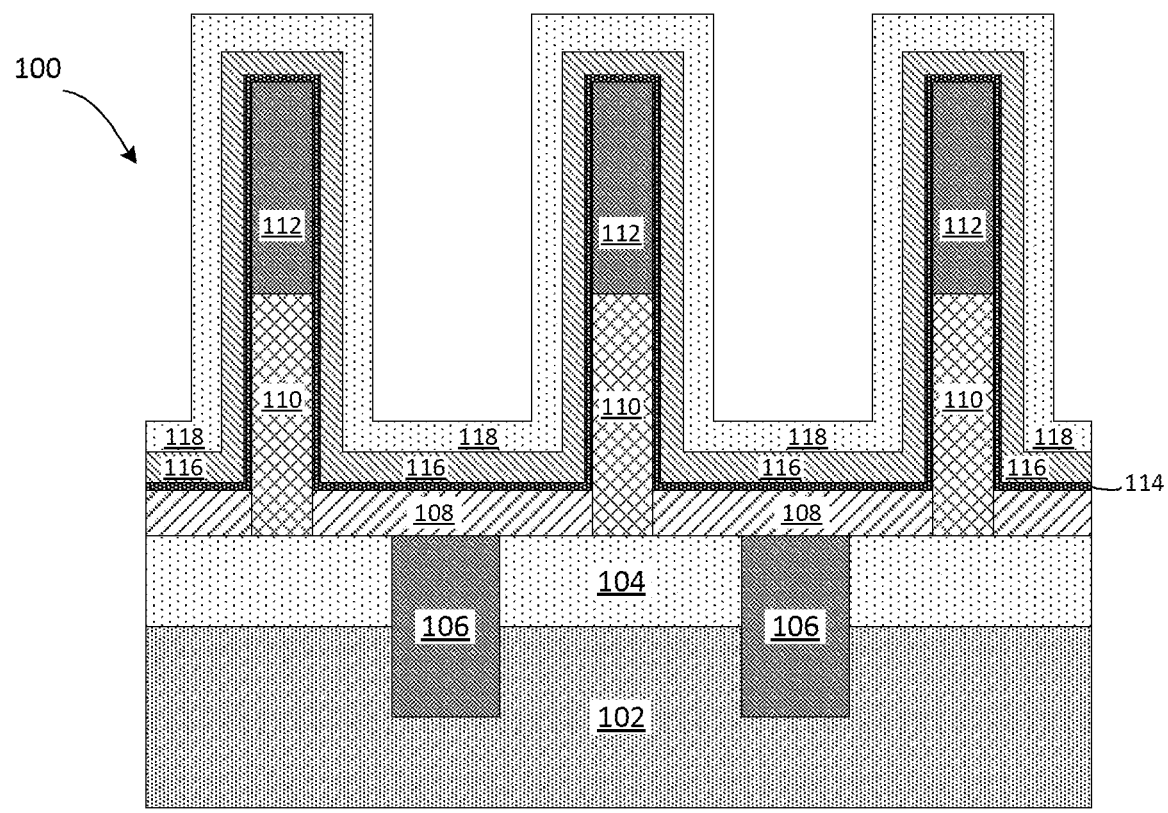
FIG. 2A is a cross-sectional view of the VTFET semiconductor device of FIG. 1A after additional fabrication operations and taken along the line X1-X1' of FIG. 1B, according to embodiments.
Figure 2B:
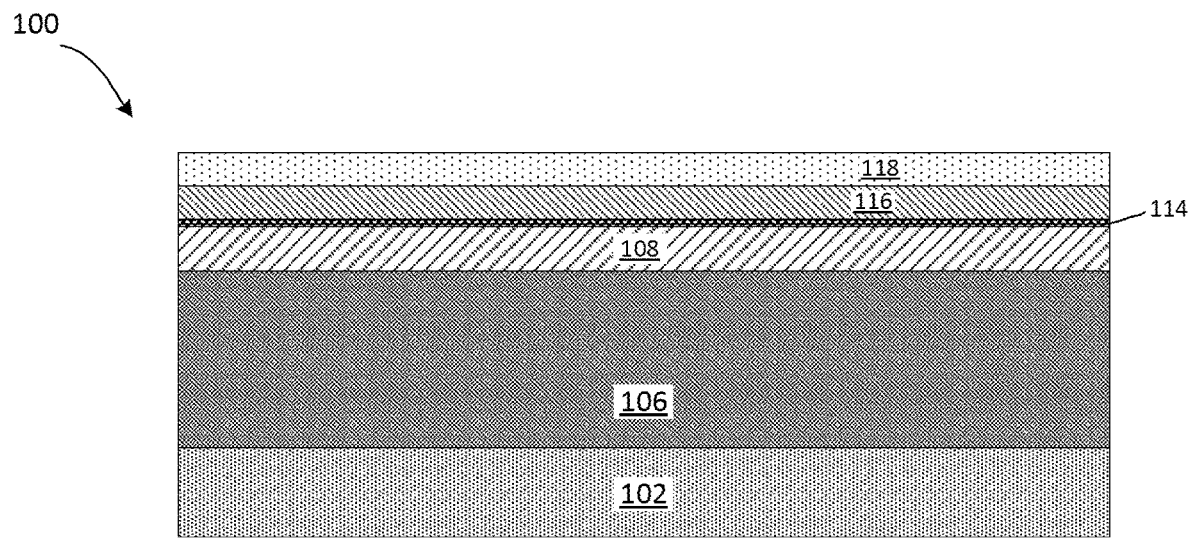
FIG. 2B is a cross-sectional view of the VTFET semiconductor device of FIG. 1C after additional fabrication operations and taken along the line Y2-Y2' of FIG. 1B, according to embodiments.
Figure 2C:
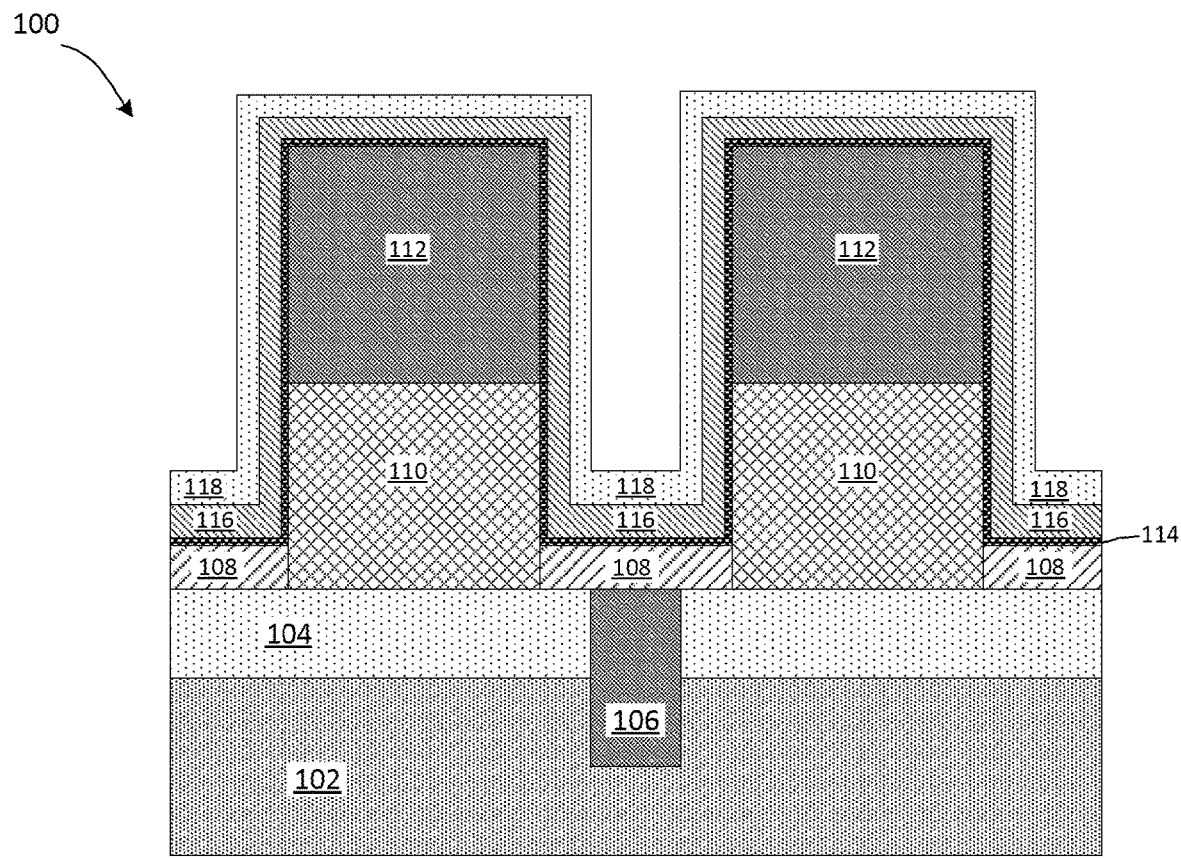
FIG. 2C is a cross-sectional view of the VTFET semiconductor device of FIG. 1D after additional fabrication operations and taken along the line Y1-Y1' of FIG. 1B, according to embodiments.

Referring now to FIGS. 2A, 2B and 2C, these figures are cross-sectional views of the VTFET semiconductor device 100 of FIG. 1A after additional fabrication operations to form a gate stack and taken along the lines X1-X1', Y2-Y2' and Y1-Y1' respectively, of FIG. 1B, according to embodiments. As shown in FIG. 2A, a high-κ dielectric layer 114 (such as $HfO_2$) is deposited over the bottom spacer layer 108 and on the sidewalls of the fins 110 and the fin hardmask 112. Then, a work function metal (WFM) layer 116 is formed on the high-κ dielectric layer 114. A material of the WFM layer 116 may be, for example, TiN, or any other suitable gate conductor material. Next, a WFM protecting layer 118 is formed on the WFM layer 116. The WFM protecting layer 118 may be, for example, a nitride layer such as SiN. Thus, as shown in FIGS. 2A-2C, a gate stack is formed of the high-κ dielectric layer 114, the WFM layer 116 and the WFM protection layer 118. It should be appreciated that the WFM metal patterning process can be done to form different WFM layers for different devices. For example, for a PFET, the WFM can be TiN, and for an NFET, the WFM can be TiAlC, or a combination of multiple layers of TiAlC and TiN.

Figure 3A:
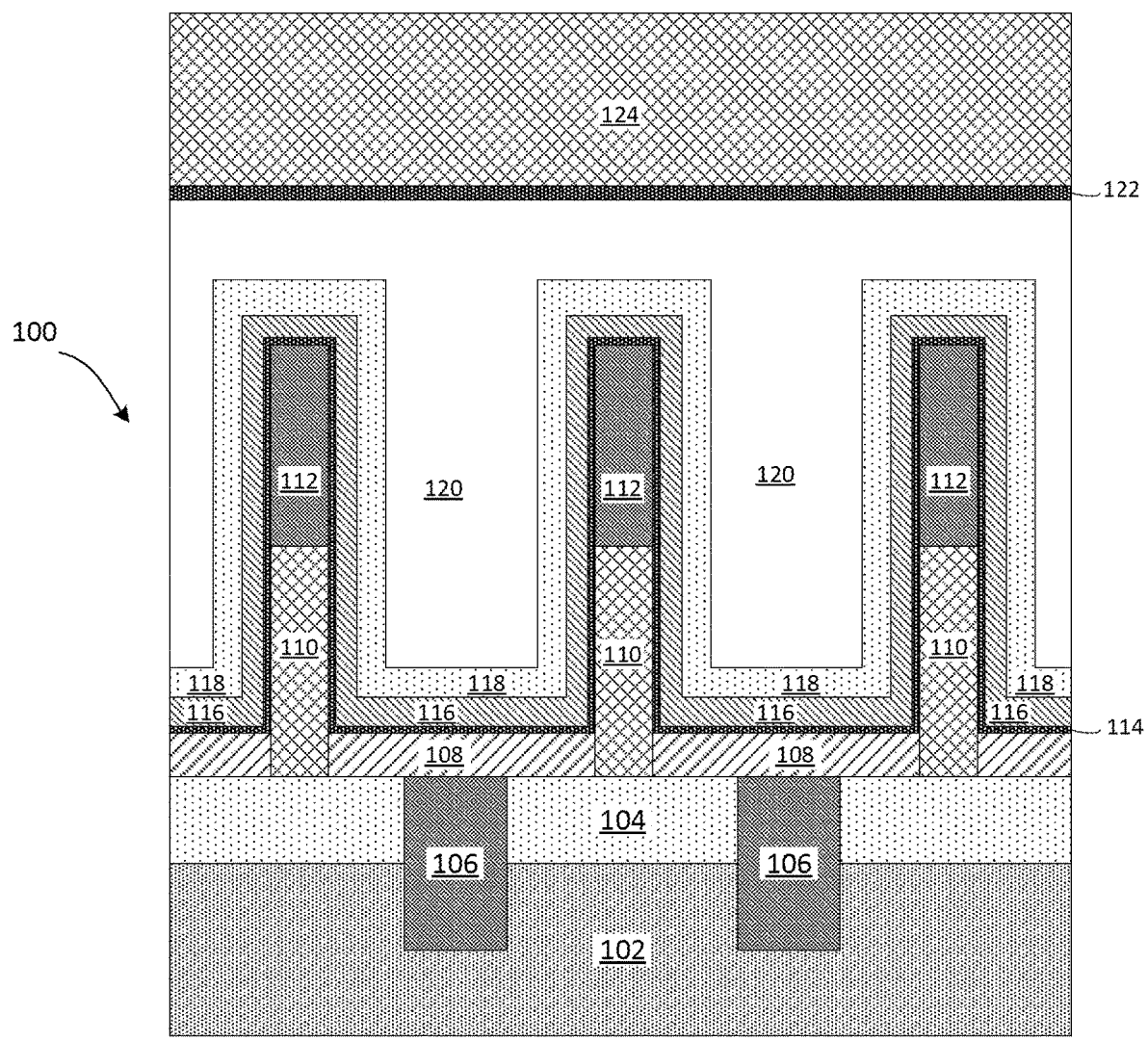
FIG. 3A is a cross-sectional view of the VTFET semiconductor device of FIG. 2A after additional fabrication operations and taken along the line X1-X1' of FIG. 3B, according to embodiments.
Figure 3B:
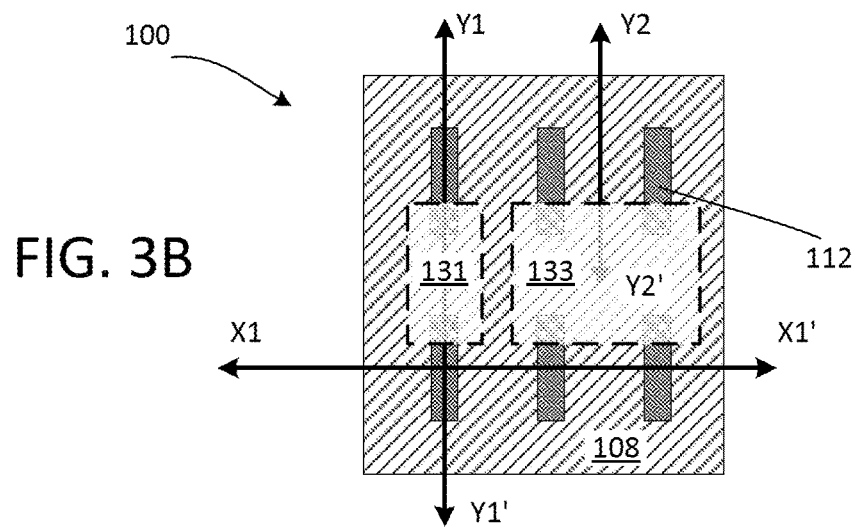
FIG. 3B is a top down view of the VTFET semiconductor device of FIG. 3A showing openings corresponding to gate landing regions, according to embodiments.
Figure 3C:
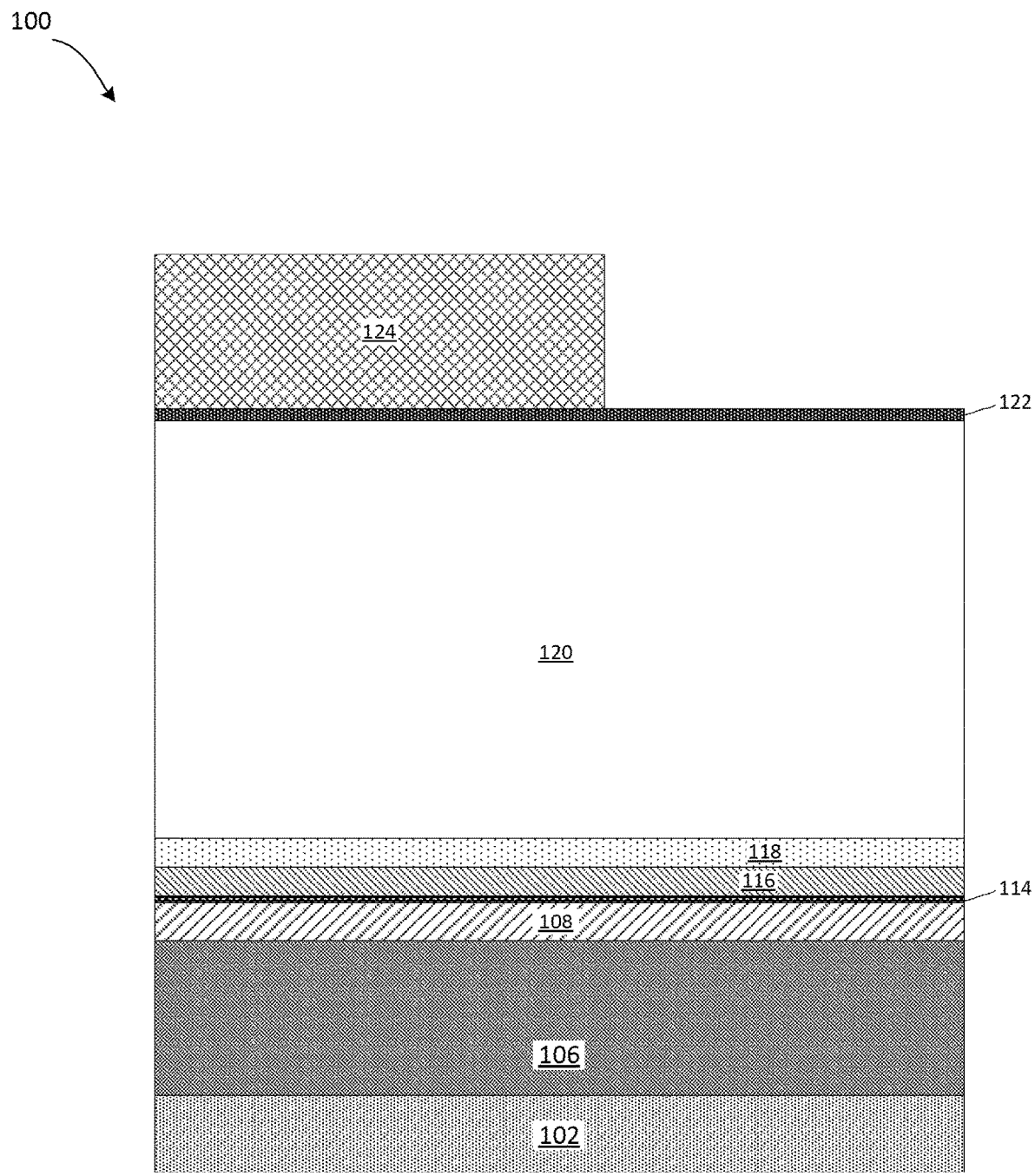
FIG. 3C is a cross-sectional view of the VTFET semiconductor device of FIG. 2B after additional fabrication operations and taken along the line Y2-Y2' of FIG. 3B, according to embodiments.
Figure 3D:
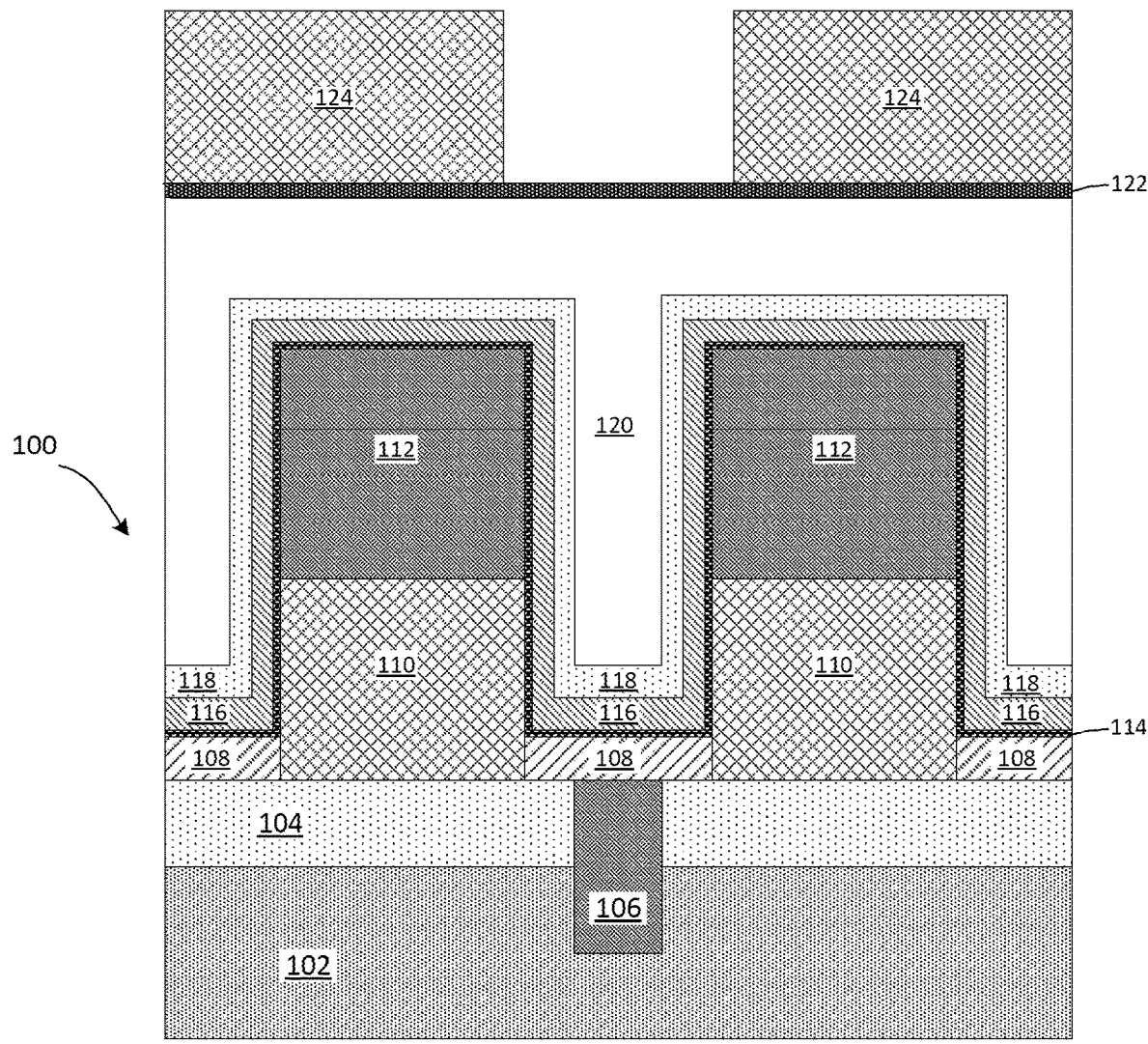
FIG. 3D is a cross-sectional view of the VTFET semiconductor device of FIG. 2C after additional fabrication operations and taken along the line Y1-Y1' of FIG. 3B, according to embodiments.

Referring now to FIG. 3A, this figure is a cross-sectional view of the VTFET semiconductor device of FIG. 2A after additional fabrication operations and taken along the line X1-X1' of FIG. 3B, according to embodiments. As shown in FIG. 3A, an organic planarization (OPL) layer 120 is formed over the VTFET semiconductor device 100. This OPL layer 120 fills in gaps between adjacent fins 110 and fin hardmasks 112. The OPL layer 120 is deposited on the resulting structure and then patterned. After the OPL layer 120 is coated, an additional litho stack such as anti-reflective coating (ARC) layer 122 (such as a low-temperature oxide (LTO) or a silicon-containing anti-reflective coating (SiARC) layer) and a photoresist layer 124 is formed on the ARC layer 122. As shown in the top down view of FIG. 3B, a first opening 131 (corresponding to a gate landing region) is formed in the photoresist layer 124 (this is also shown in the cross-sectional view of FIG. 3D) by any suitable conventional lithography exposure and development process. As also shown in FIG. 3B, a second opening 133 (corresponding to a gate landing region) is formed in the photoresist layer 124 (this is also shown in the cross-sectional view of FIG. 3C). As shown in FIG. 3B, the first opening 131 and the second opening 133 are large enough to overlap with the fins at least partially 110 and fin hardmasks 112 in plan view. Thus, the patterning of the photoresist layer 124 allows for the opening up of the region where there is to be a gate connection in subsequent processing operations.

Figure 4A:
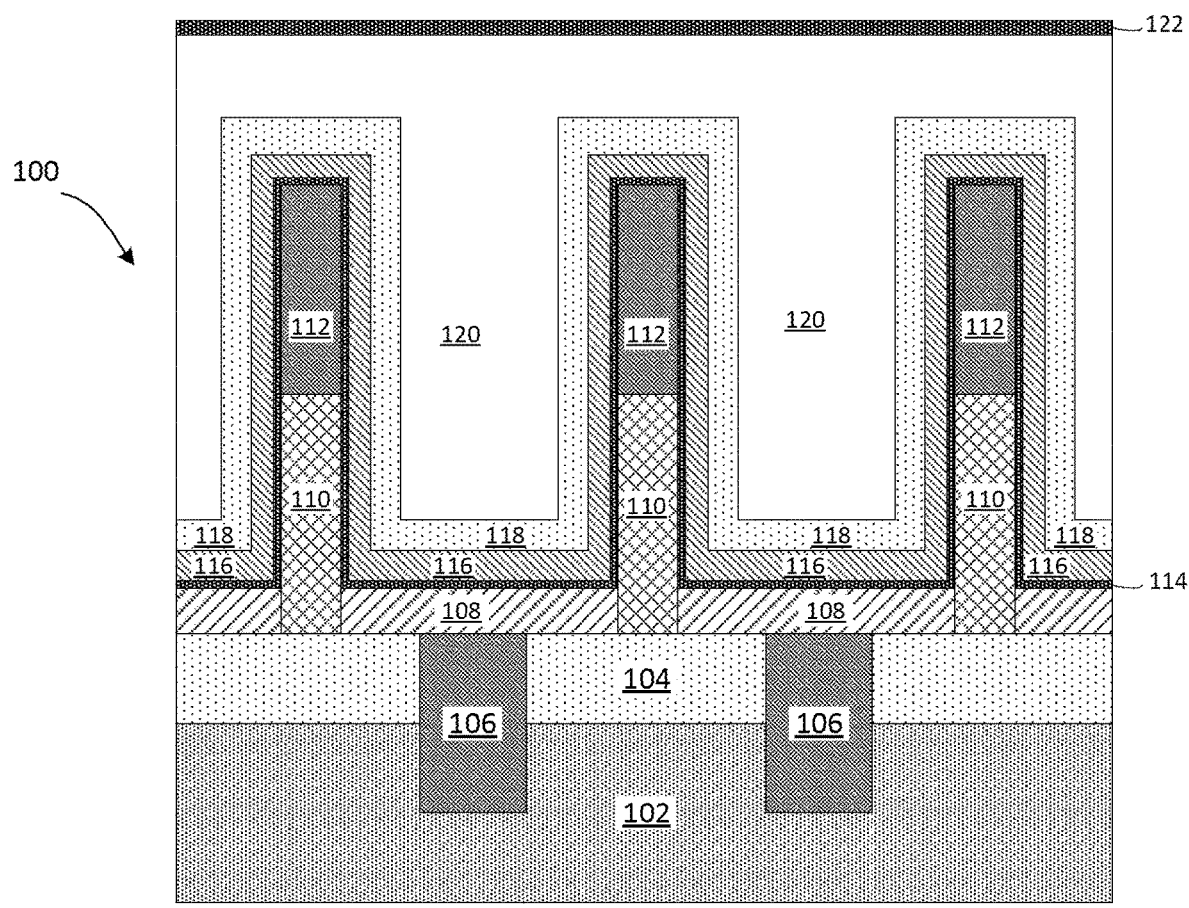
FIG. 4A is a cross-sectional view of the VTFET semiconductor device of FIG. 3A after additional fabrication operations and taken along the line X1-X1' of FIG. 3B, according to embodiments.
Figure 4B:
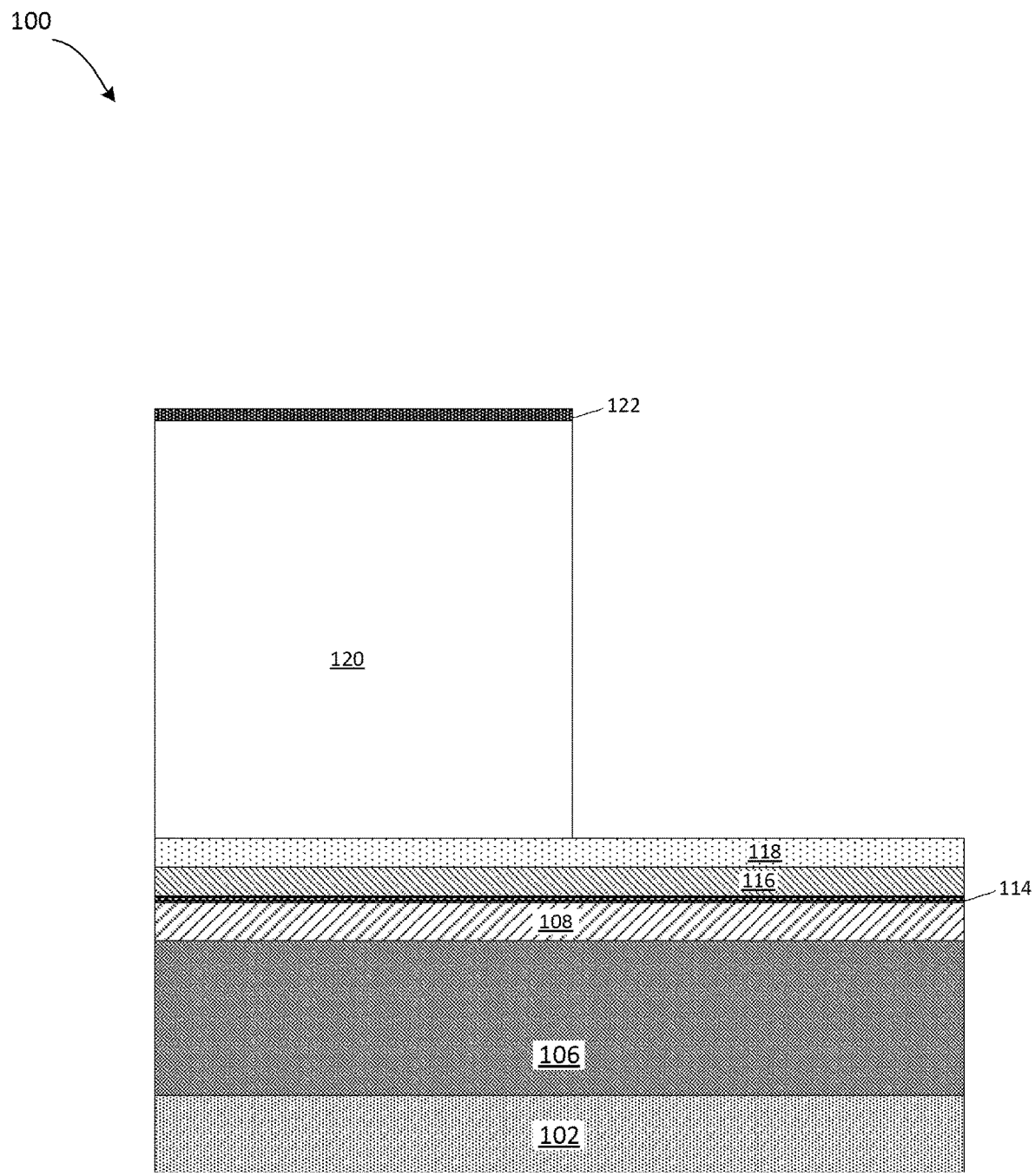
FIG. 4B is a cross-sectional view of the VTFET semiconductor device of FIG. 3C after additional fabrication operations and taken along the line Y2-Y2' of FIG. 3B, according to embodiments.
Figure 4C:
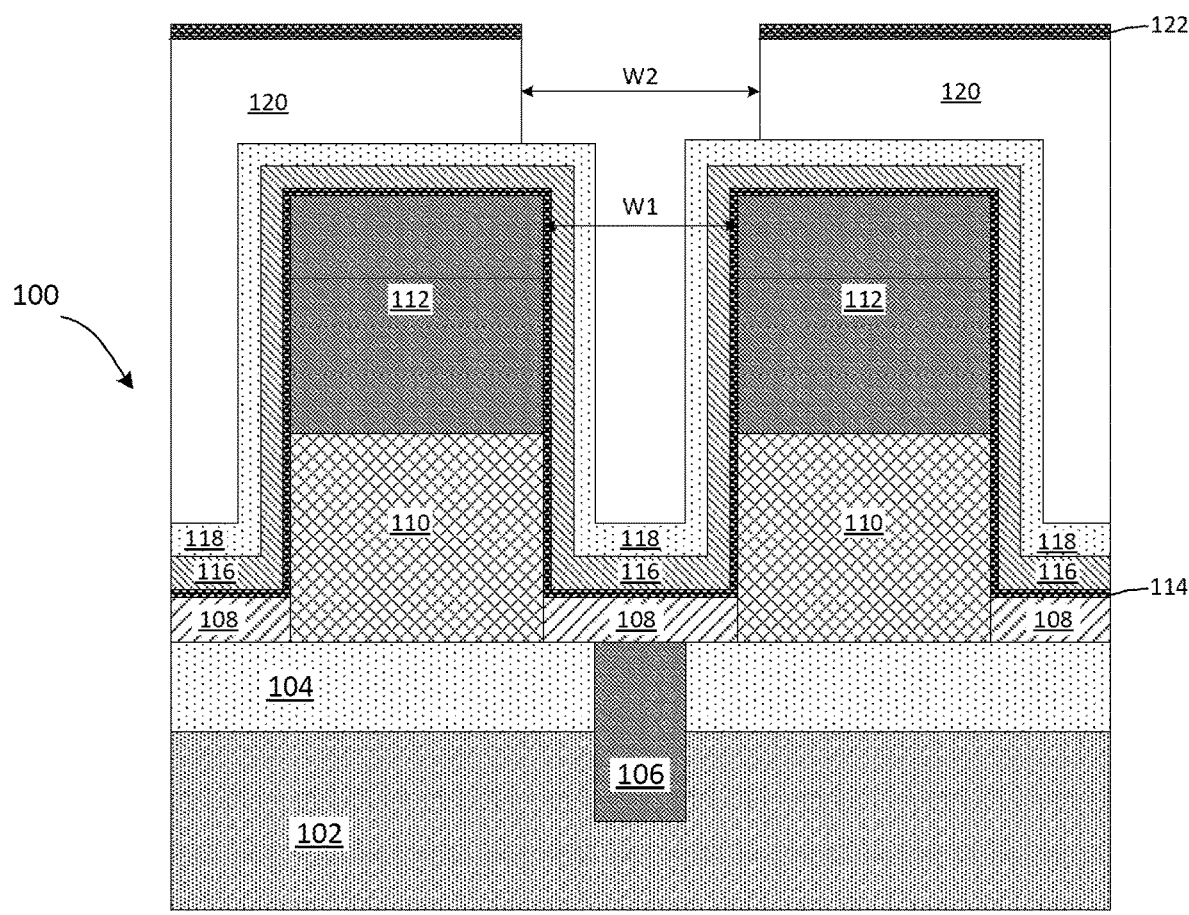
FIG. 4C is a cross-sectional view of the VTFET semiconductor device of FIG. 3D after additional fabrication operations and taken along the line Y1-Y1' of FIG. 3B, according to embodiments.

Referring now to FIG. 4A, this figure is a cross-sectional view of the VTFET semiconductor device of FIG. 3A after additional fabrication operations and taken along the line X1-X1' of FIG. 3B, according to embodiments. As shown in FIG. 4A, an ARC/OPL etch operation is performed to remove portions of the ARC layer 122 and the OPL layer 120 that is not covered by photo resist. First, portions of the ARC layer 122 are removed that are not covered by the photoresist layer 124, as shown in FIGS. 4B and 4C. Then, the OPL layer 120 that is not covered by photo resist and ARC is etched. Since the material of the photoresist layer 124 may be somewhat similar (at least in regard to etching characteristics) as the material of the OPL layer 120, and they may both comprise an organic material, during OPL etch, all exposed photo resist above ARC layer is also etched. As shown in FIG. 4B, the portion of the OPL layer 120 that is removed corresponds to the second opening 133 shown in FIG. 3B taken along the line Y2-Y2'. Also, as shown in FIG. 4C, the portion of the OPL layer 120 that is removed corresponds to the first opening 131 shown in FIG. 3B taken along the line Y1-Y1'. As shown in FIG. 4C, the width W2 of the first opening 131 in the OPL layer 120 is greater than the dimension W1 which is the distance between adjacent fins 110 and fin hardmasks 112. Thus, the first opening 131 overlaps in plan view with the fins 110, as shown in FIG. 3B.

Figure 5A:
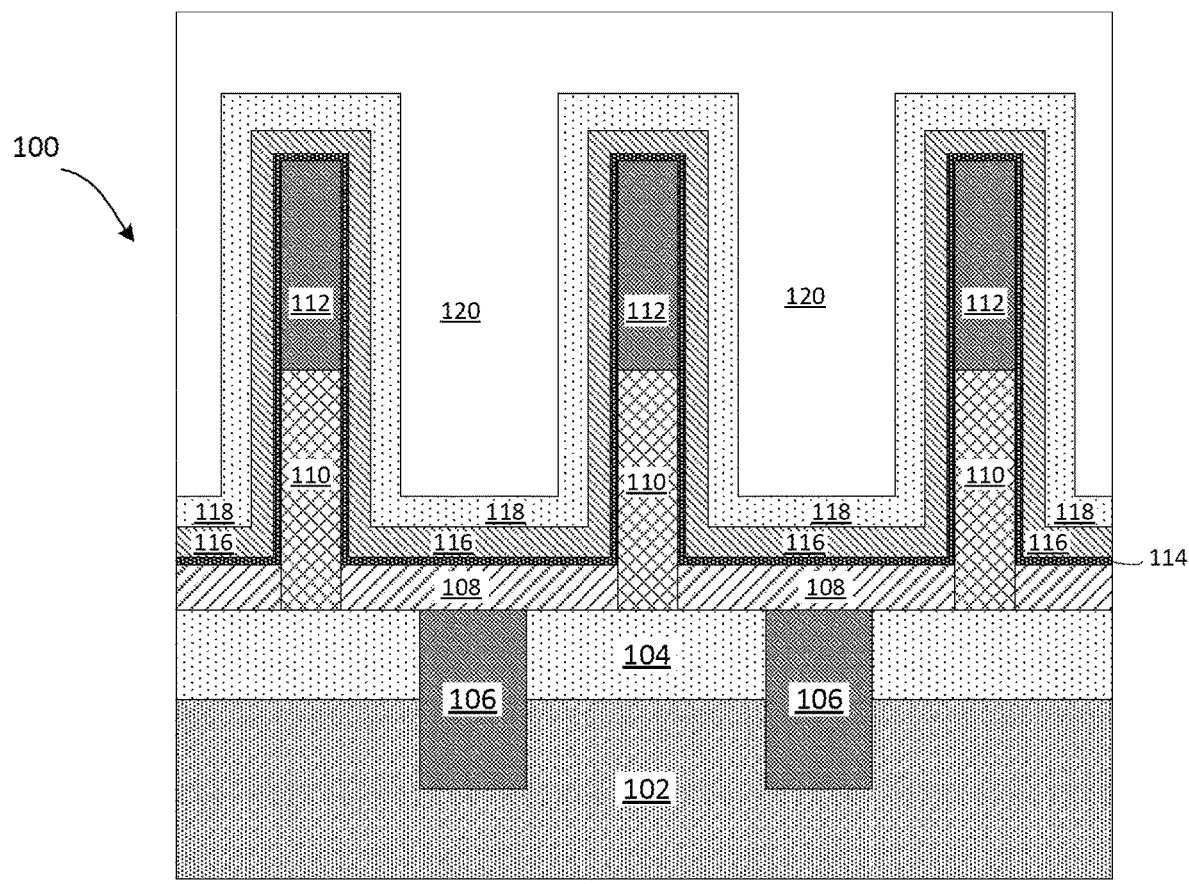
FIG. 5A is a cross-sectional view of the VTFET semiconductor device of FIG. 4A after additional fabrication operations and taken along the line X1-X1' of FIG. 3B, according to embodiments.
Figure 5B:
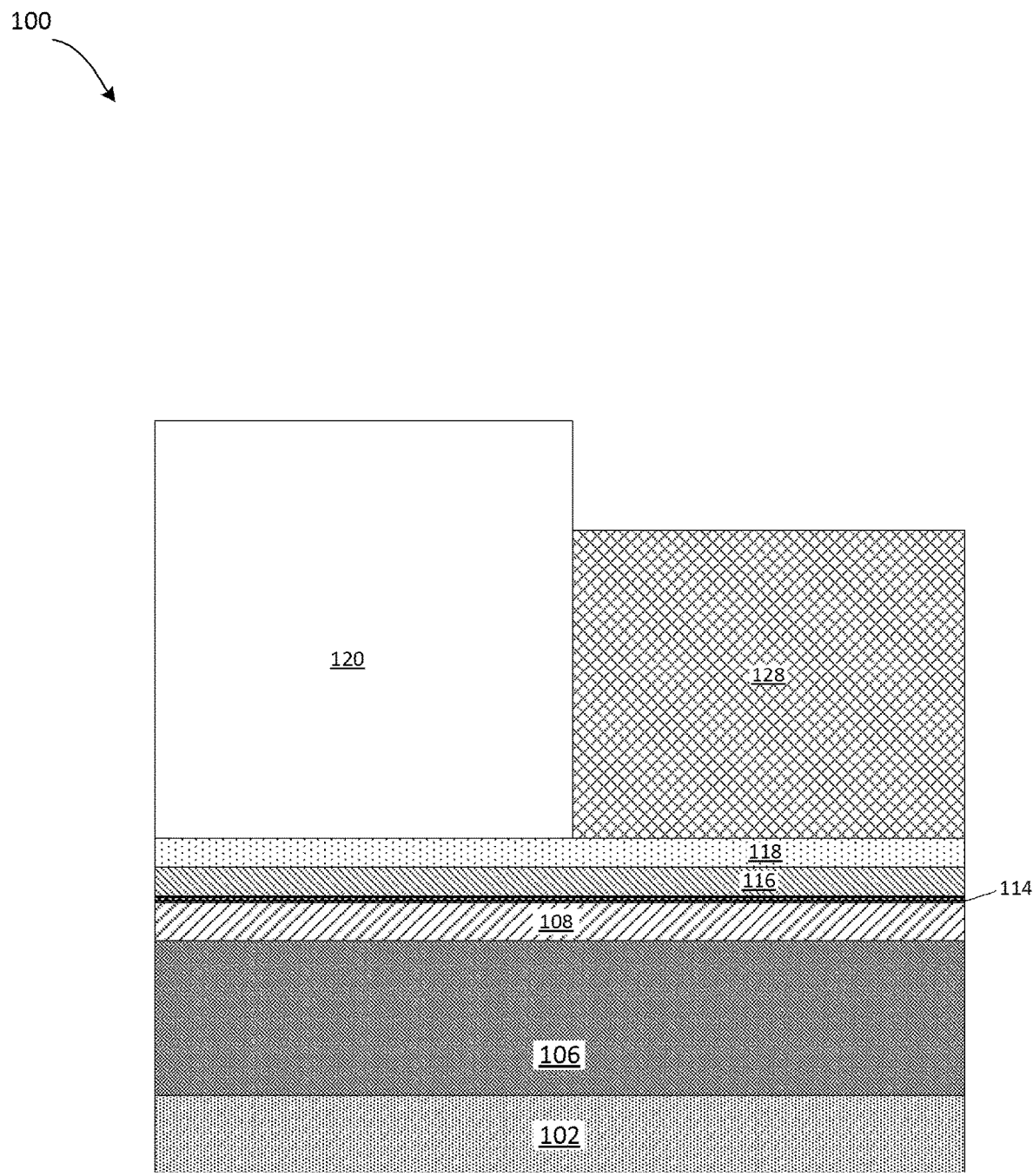
FIG. 5B is a cross-sectional view of the VTFET semiconductor device of FIG. 4B after additional fabrication operations and taken along the line Y2-Y2' of FIG. 3B, according to embodiments.
Figure 5C:
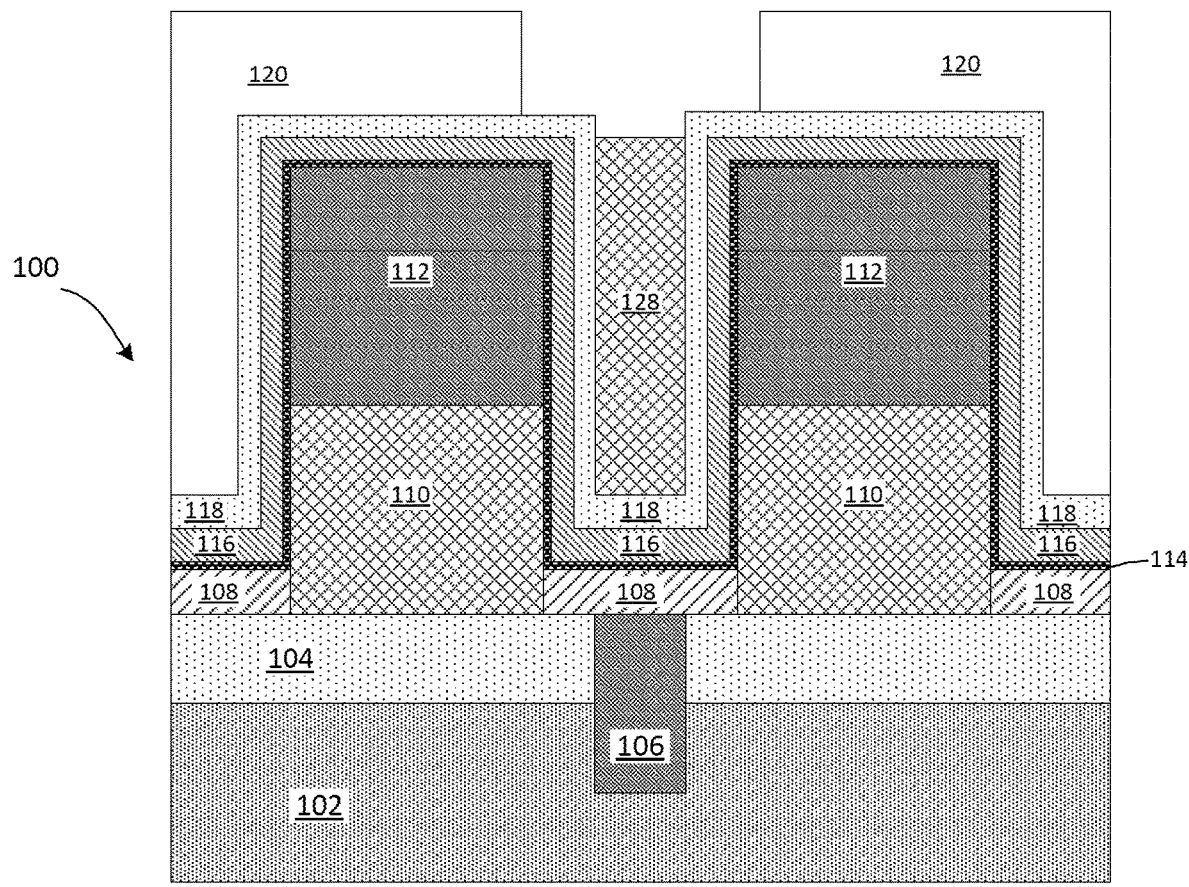
FIG. 5C is a cross-sectional view of the VTFET semiconductor device of FIG. 4C after additional fabrication operations and taken along the line Y1-Y1' of FIG. 3B, according to embodiments.

Referring now to FIG. 5B (the cross-sectional figure of FIG. 5A is the same as in FIG. 4A), this figure is a cross-sectional view of the VTFET semiconductor device 100 of FIG. 4B after additional fabrication operations and taken along the line Y2-Y2' of FIG. 3B, according to embodiments. As shown in FIG. 5B, a first ILD layer 128 (e.g., an oxide layer) is deposited, for example, with an atomic layer deposition (ALD) technique. In certain examples, the first ILD layer 128 may be initially deposited up to or above the level of the ARC layer 122, and then etched back so that the final level of the first ILD layer 128 is slightly below an upper surface of the WFM protecting layer 118, as shown in FIG. 5C. During the first ILD etch back process, the ARC layer 122 above OPL layer 120 is also removed. Thus, the gate area (or gate landing region) above the isolation region 106 shown in FIG. 5C is now protected by the first ILD layer 128. Also, the gate area above the high-κ dielectric layer 114 shown in FIG. 5B is also protected by the first ILD layer 128.

Figure 6A:
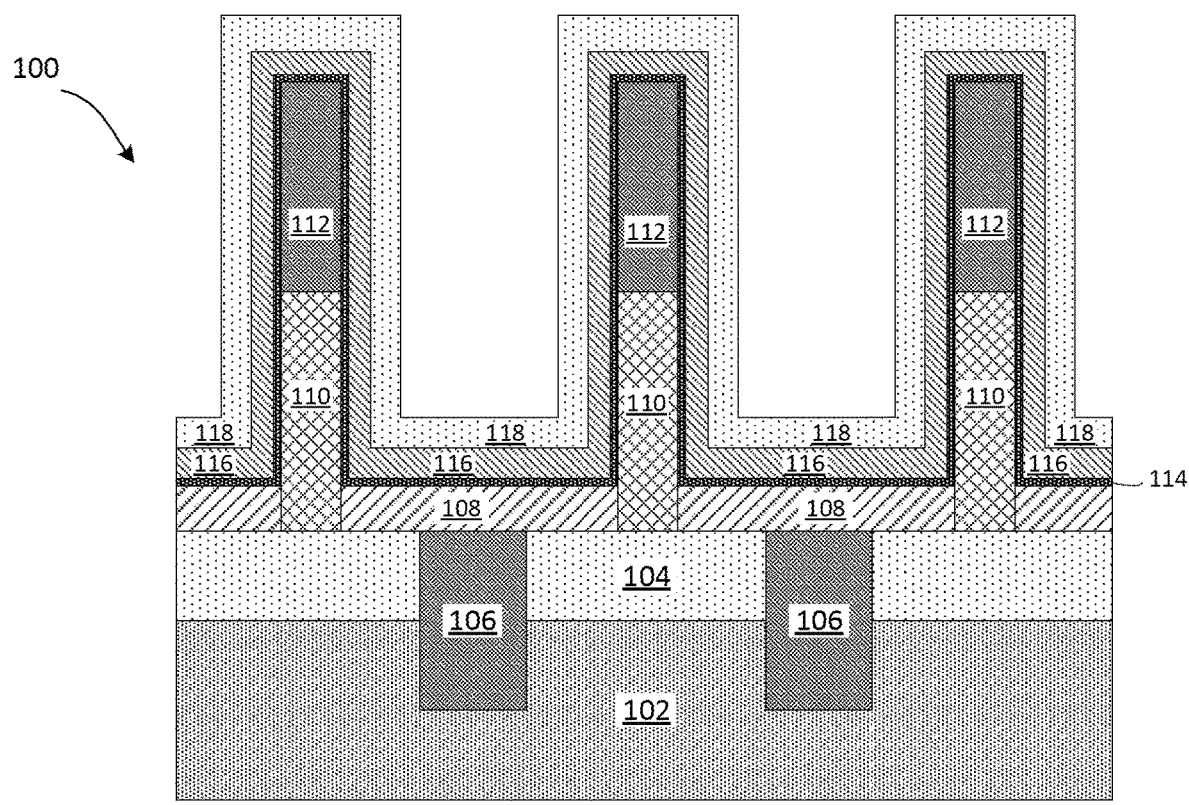
FIG. 6A is a cross-sectional view of the VTFET semiconductor device of FIG. 5A after additional fabrication operations and taken along the line X1-X1' of FIG. 3B, according to embodiments.
Figure 6B:
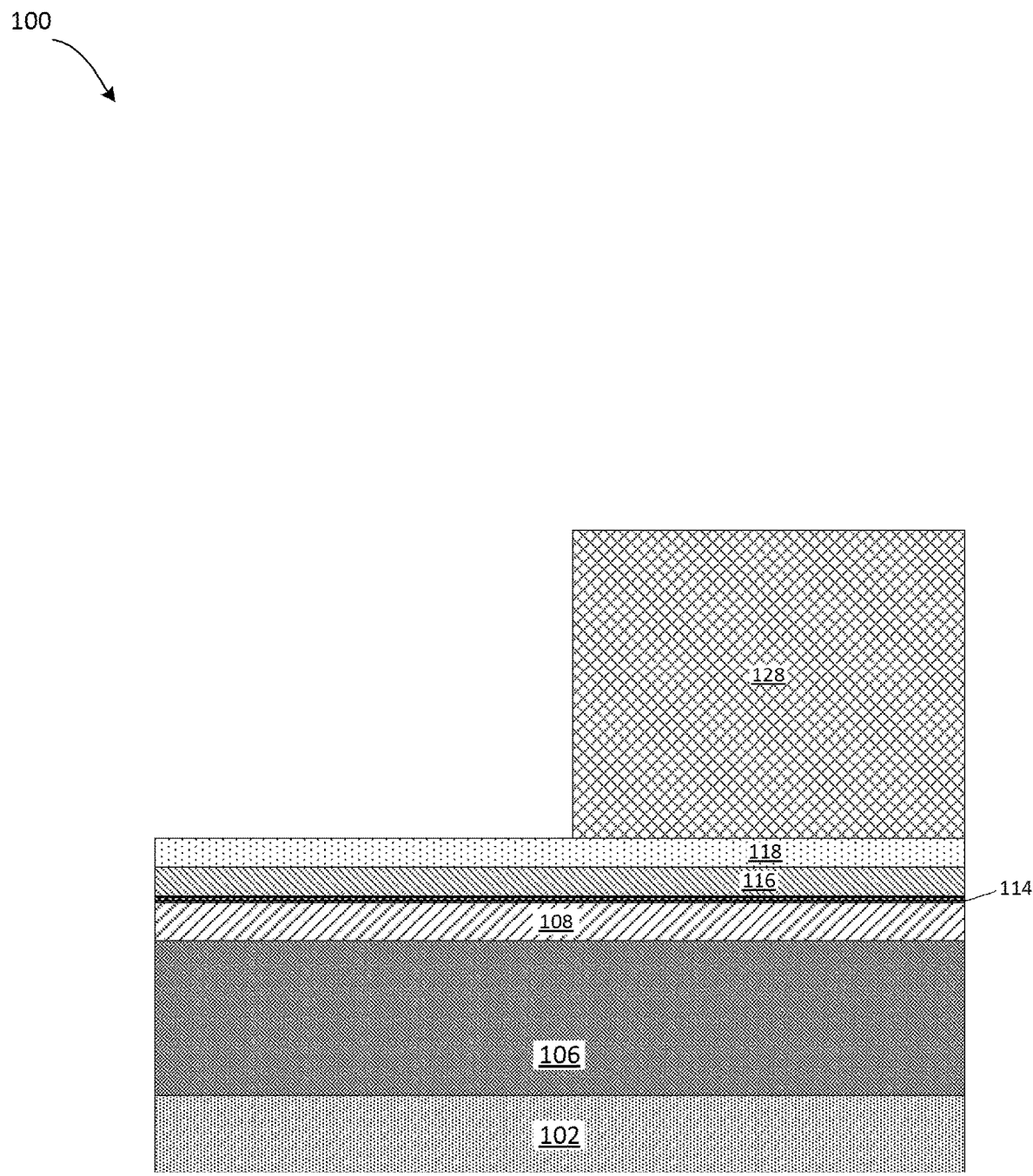
FIG. 6B is a cross-sectional view of the VTFET semiconductor device of FIG. 5B after additional fabrication operations and taken along the line Y2-Y2' of FIG. 3B, according to embodiments.
Figure 6C:
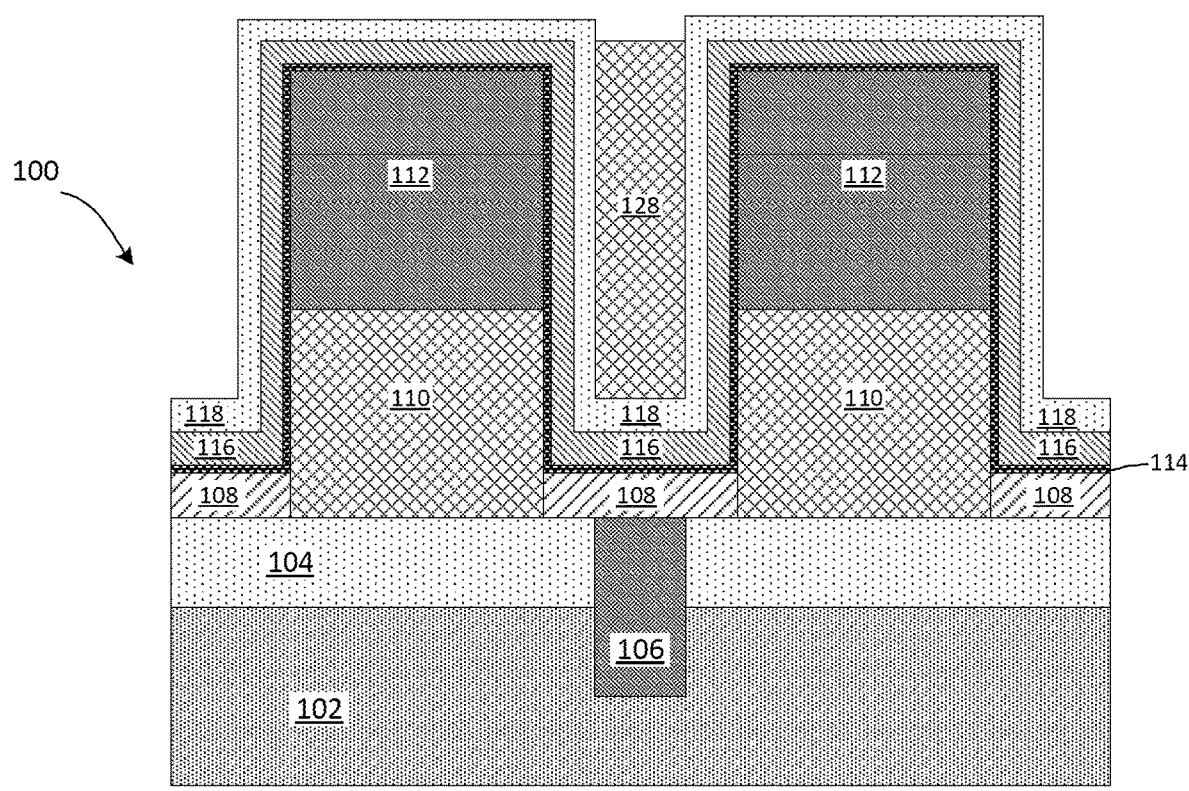
FIG. 6C is a cross-sectional view of the VTFET semiconductor device of FIG. 5C after additional fabrication operations and taken along the line Y1-Y1' of FIG. 3B, according to embodiments.

Referring now to FIG. 6A, this figure is a cross-sectional view of the VTFET semiconductor device 100 of FIG. 5A after additional fabrication operations and taken along the line X1-X1' of FIG. 3B, according to embodiments. As shown in FIG. 6A, the remaining portions of the OPL layer 120 are removed with, for example, an ashing process. In general, ashing (or plasma ashing) involves removing organic matter through the application of plasma. The process gas is usually oxygen or a fluorine containing gas for the plasma ashing process. If there is inorganic matter, it will turn into a residue known as ash, in the plasma asher. The byproducts of this process are mainly volatile carbon oxides and water vapor. In certain examples, these byproducts are pumped away with a vacuum pump within the plasma asher.

Figure 7A:
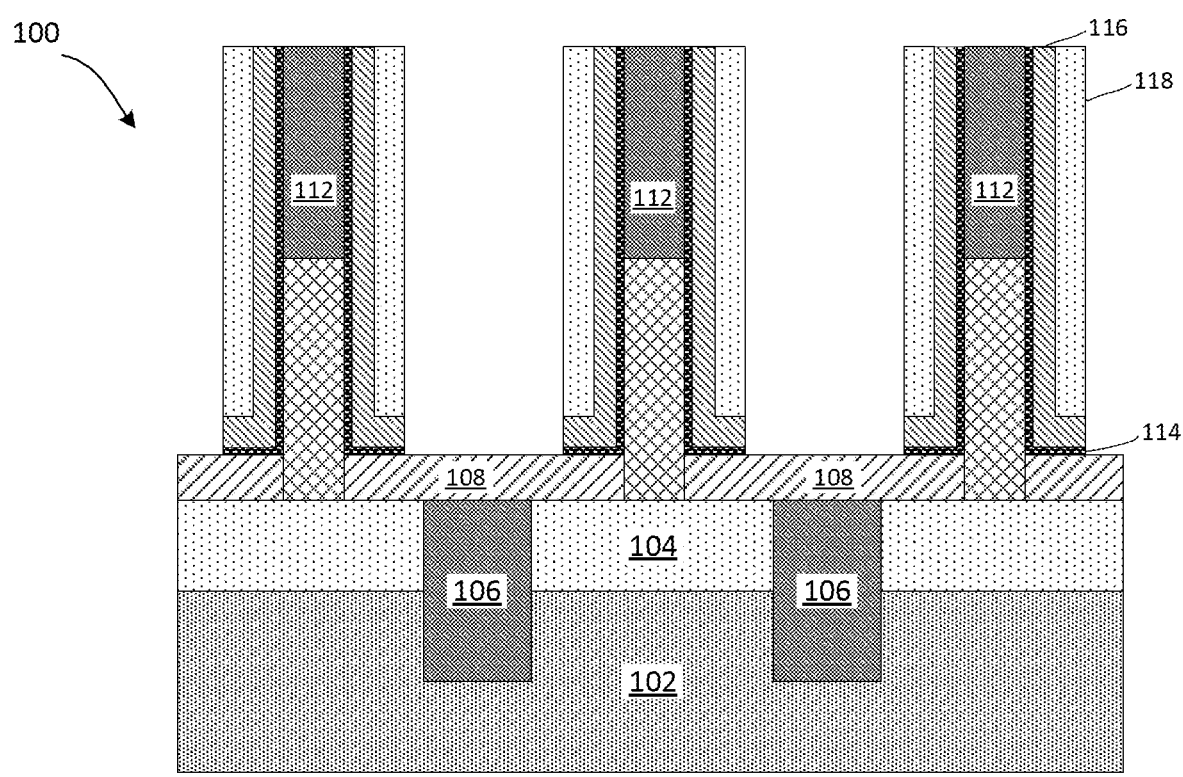
FIG. 7A is a cross-sectional view of the VTFET semiconductor device of FIG. 6A after additional fabrication operations and taken along the line X1-X1' of FIG. 3B, according to embodiments.
Figure 7B:
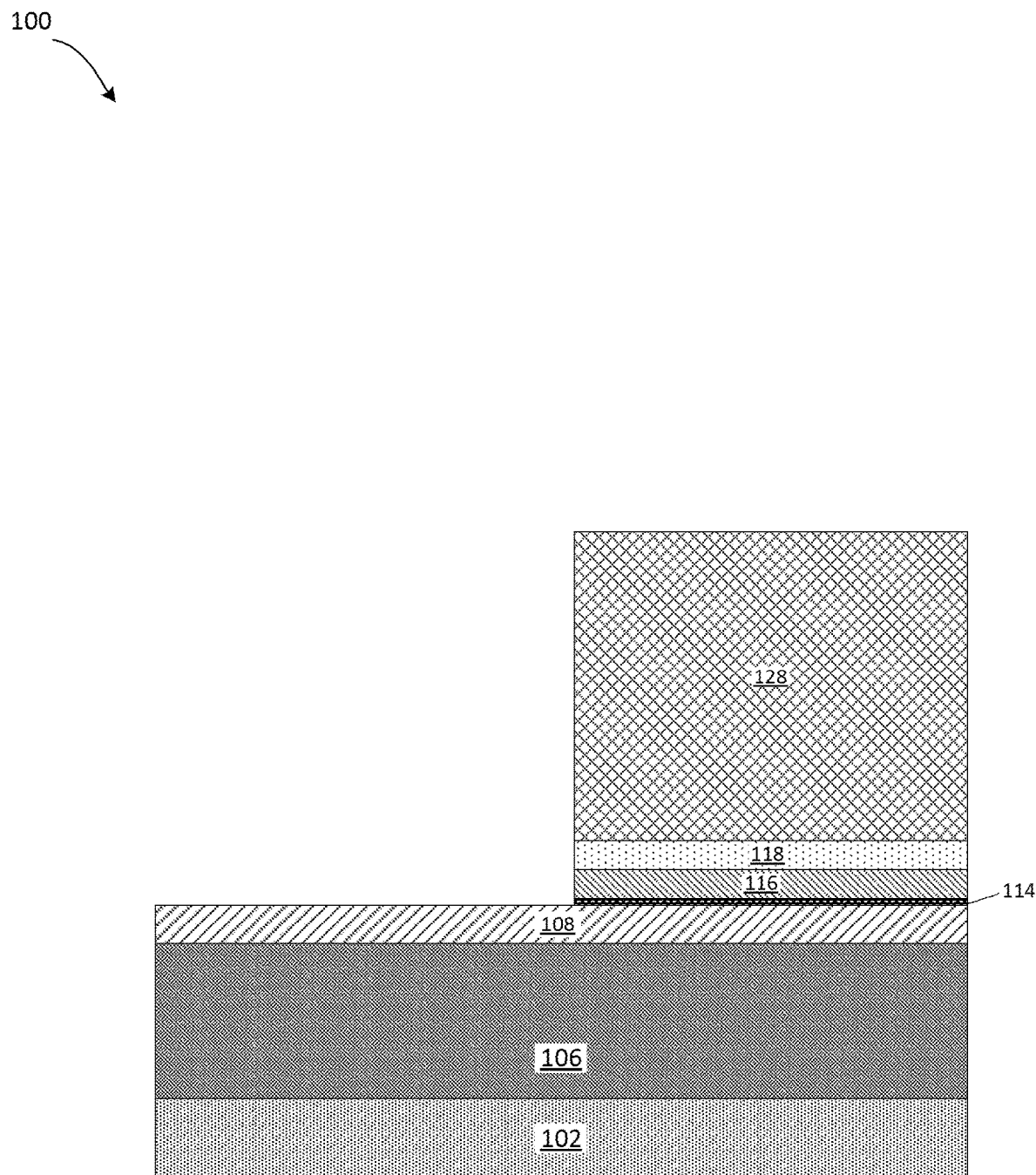
FIG. 7B is a cross-sectional view of the VTFET semiconductor device of FIG. 6B after additional fabrication operations and taken along the line Y2-Y2' of FIG. 3B, according to embodiments.
Figure 7C:
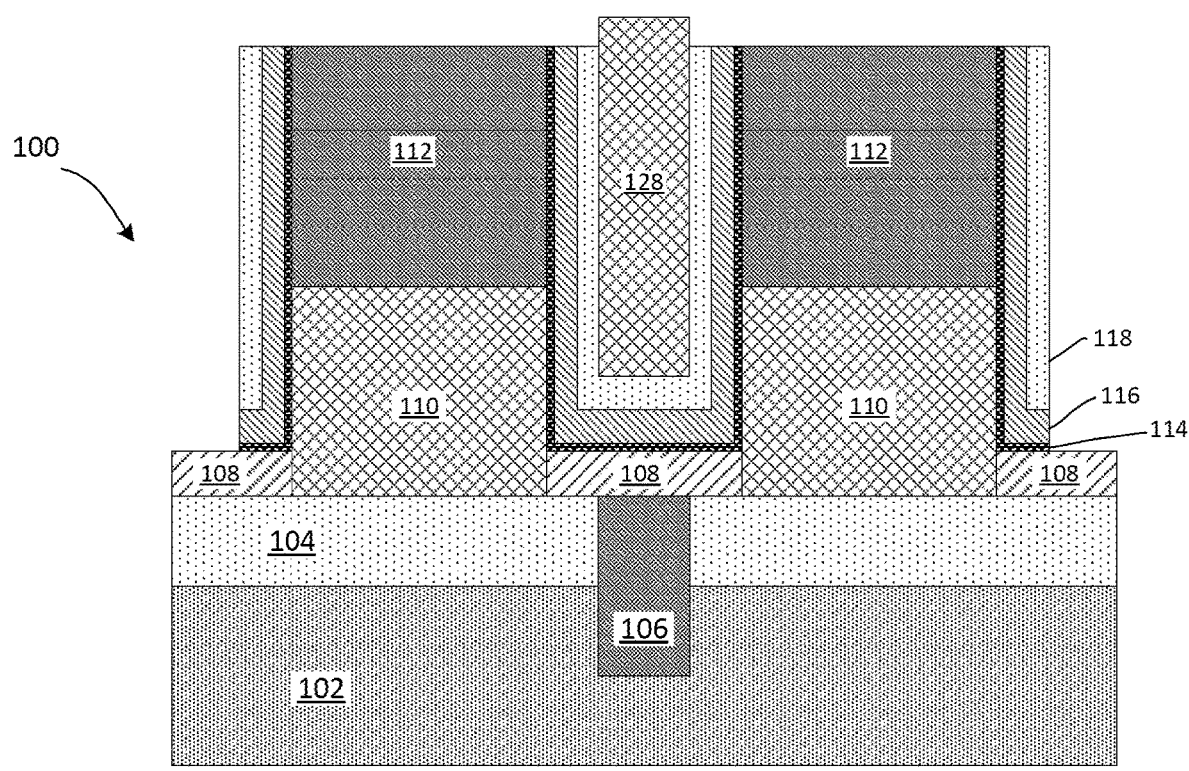
FIG. 7C is a cross-sectional view of the VTFET semiconductor device of FIG. 6C after additional fabrication operations and taken along the line Y1-Y1' of FIG. 3B, according to embodiments.

Referring now to FIG. 7A, this figure is a cross-sectional view of the VTFET semiconductor device 100 of FIG. 6A after additional fabrication operations and taken along the line X1-X1' of FIG. 3B, according to embodiments. As shown in FIGS. 7A, 7B and 7C, a material removal process (e.g., reactive ion etching (RIE)) is performed on the VTFET semiconductor device 100 to remove horizontal portions of the WFM protecting layer 118, horizontal portions of the WFM layer 116, and horizontal portions of the high-κ dielectric layer 114. That is, vertical portions of these layers and horizontal portions of these layers covered by first ILD 128 remain on the wafer, as shown in FIGS. 7A-7C.

Figure 8A:
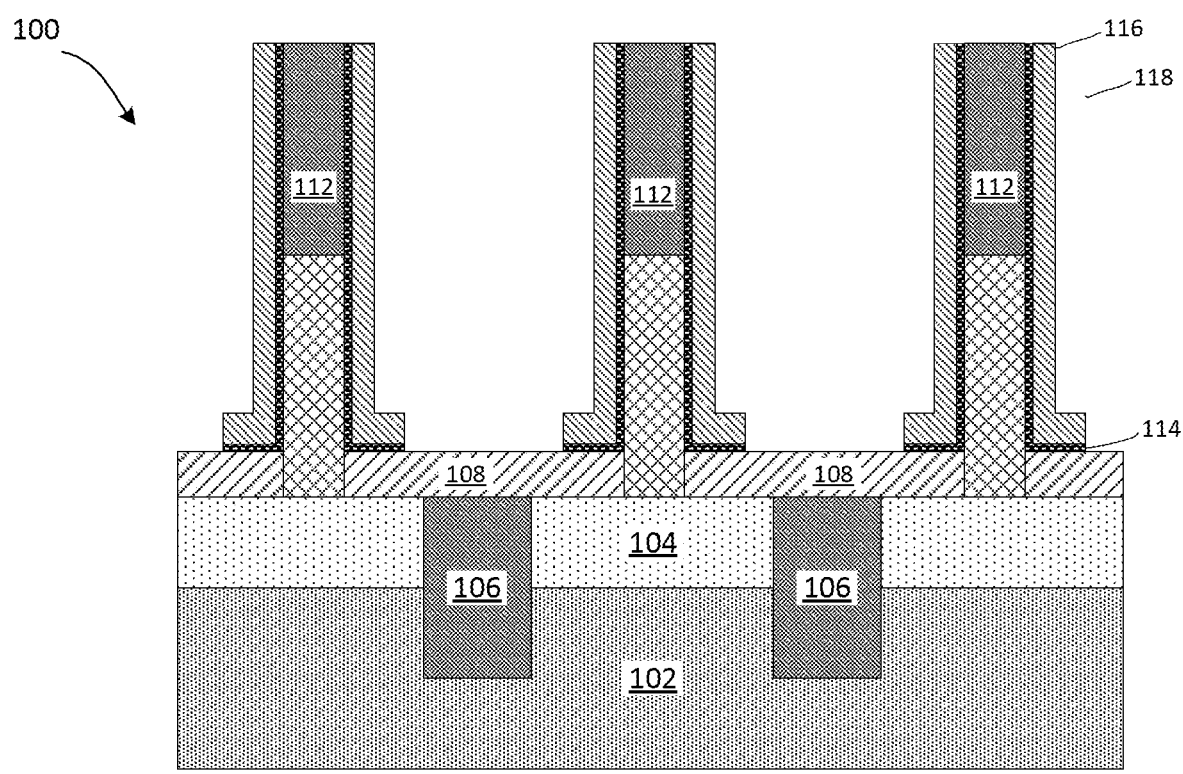
FIG. 8A is a cross-sectional view of the VTFET semiconductor device of FIG. 7A after additional fabrication operations and taken along the line X1-X1' of FIG. 3B, according to embodiments.
Figure 8B:
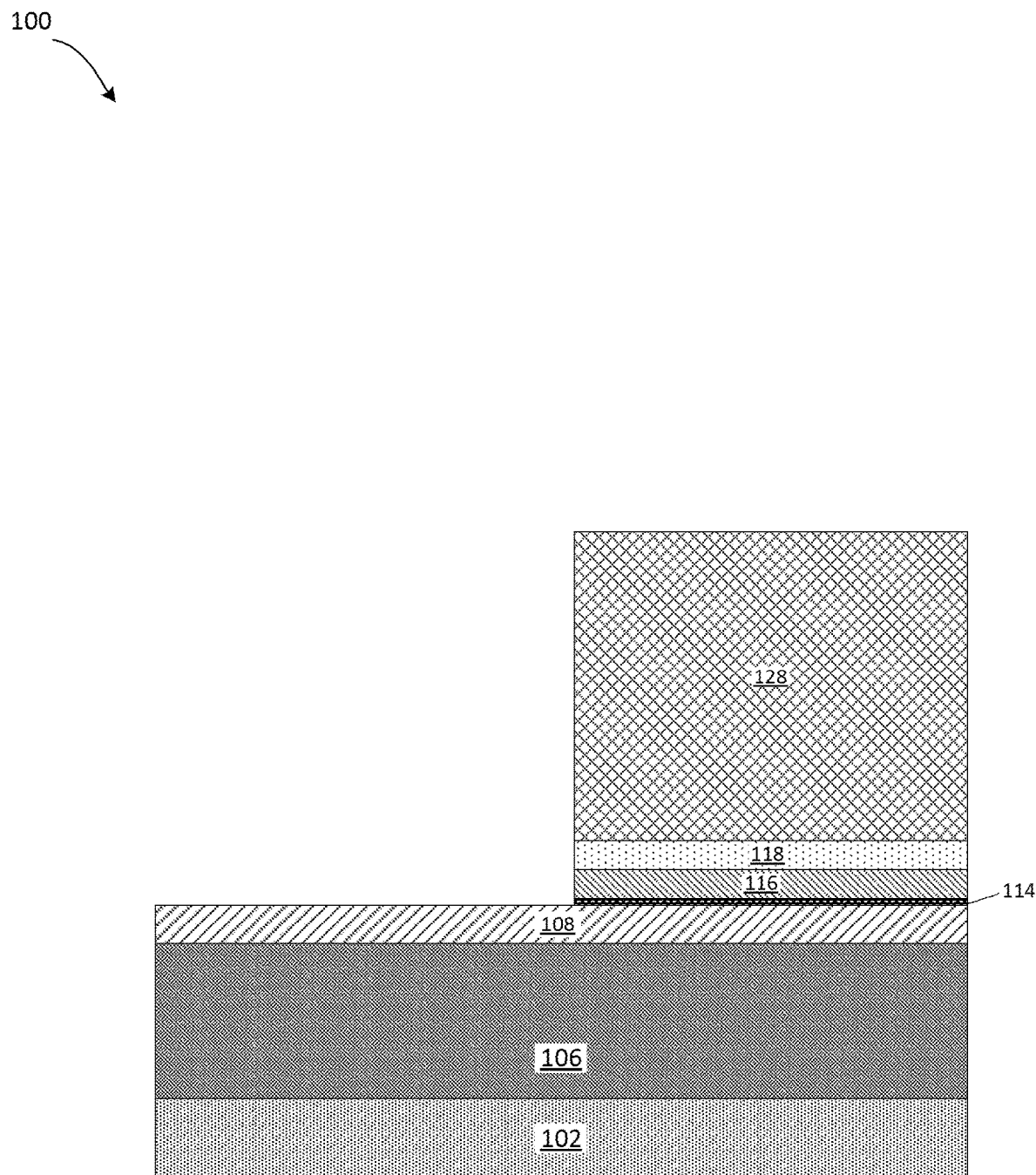
FIG. 8B is a cross-sectional view of the VTFET semiconductor device of FIG. 7B after additional fabrication operations and taken along the line Y2-Y2' of FIG. 3B, according to embodiments.
Figure 8C:
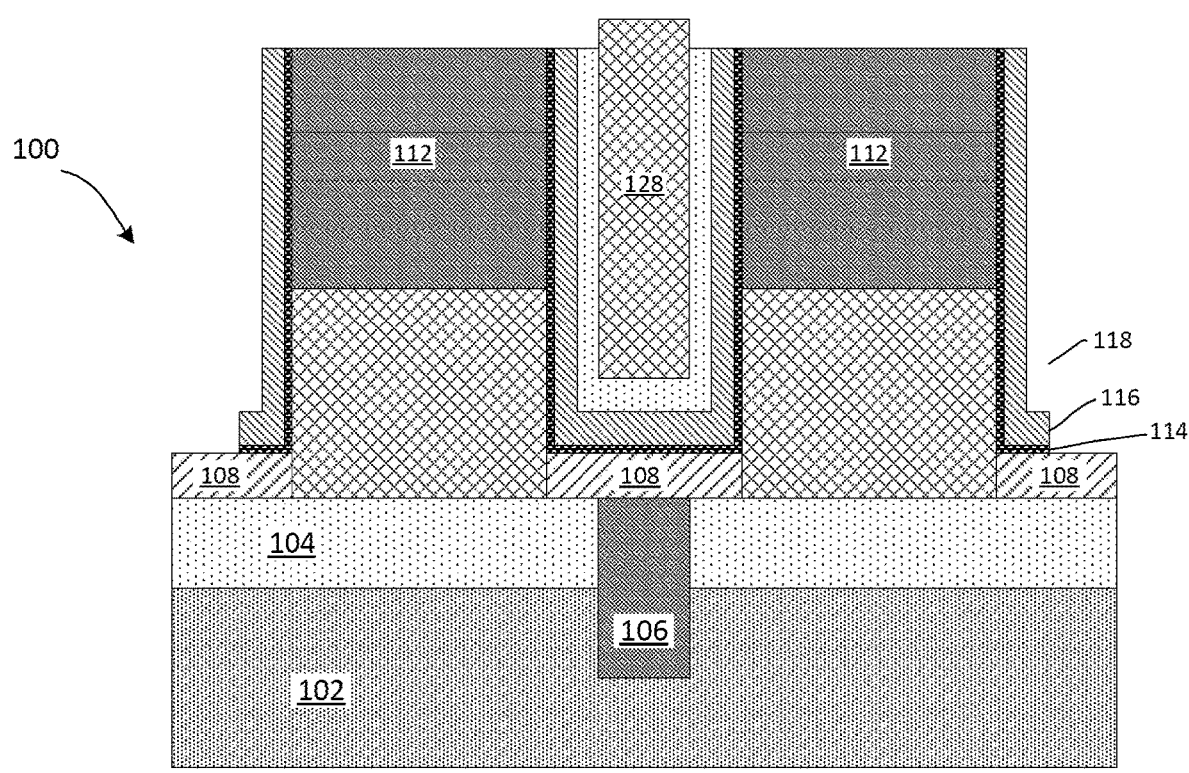
FIG. 8C is a cross-sectional view of the VTFET semiconductor device of FIG. 7C after additional fabrication operations and taken along the line Y1-Y1' of FIG. 3B, according to embodiments.

Referring now to FIG. 8A, this figure is a cross-sectional view of the VTFET semiconductor device 100 of FIG. 7A after additional fabrication operations and taken along the line X1-X1' of FIG. 3B, according to embodiments. As shown in FIGS. 8A-8C, the exposed WFM protecting layer 118 are then removed with any suitable material removal process.

Figure 9A:
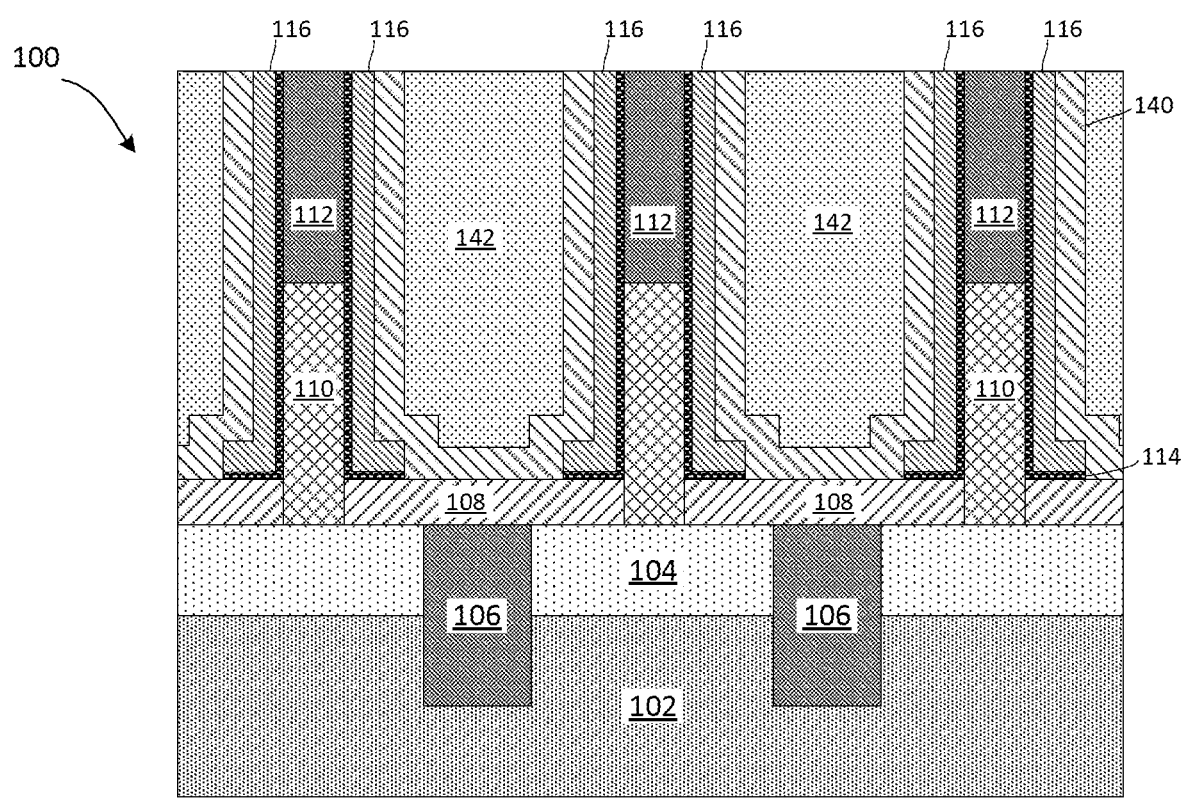
FIG. 9A is a cross-sectional view of the VTFET semiconductor device of FIG. 8A after additional fabrication operations and taken along the line X1-X1' of FIG. 3B, according to embodiments.
Figure 9B:
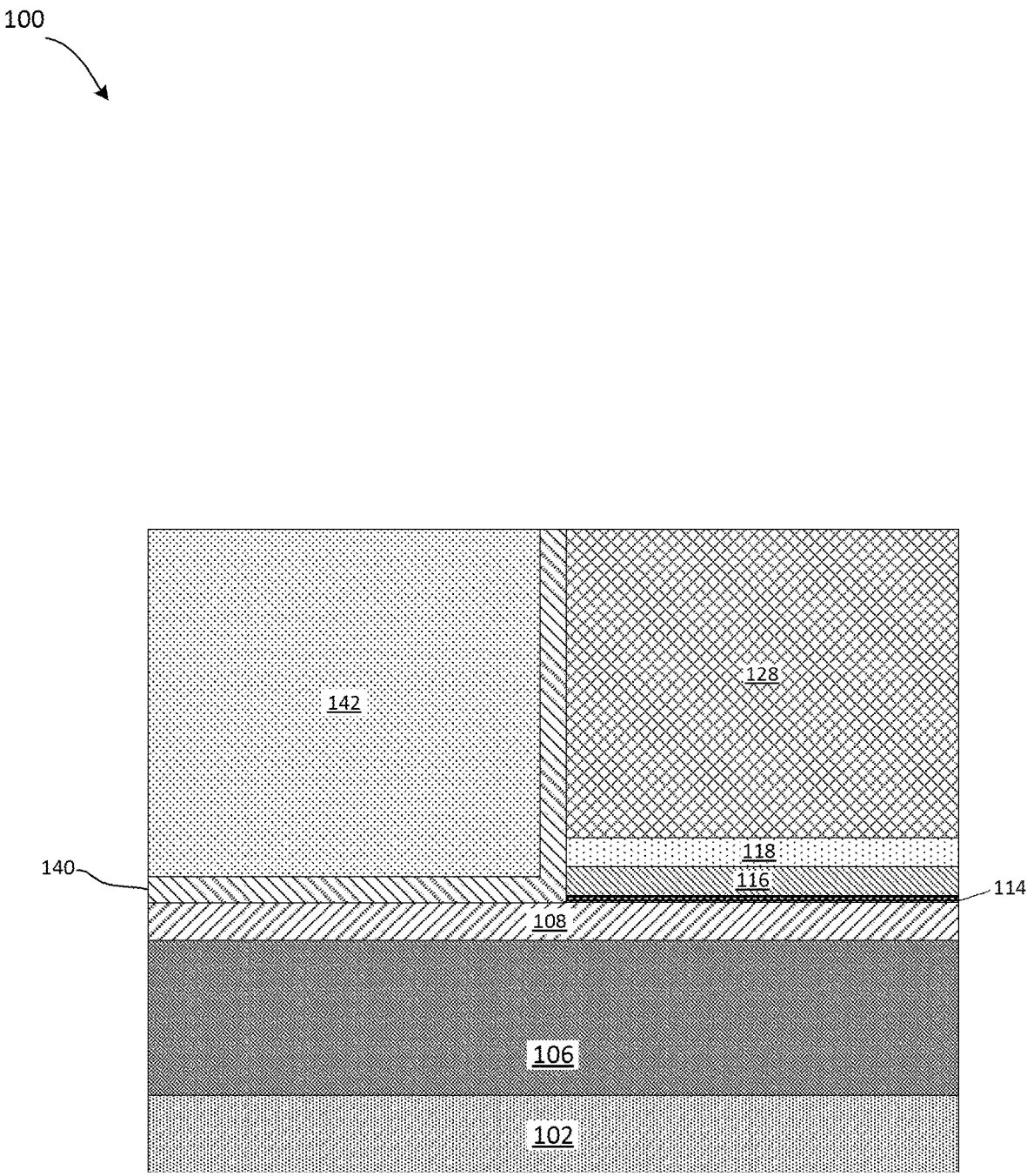
FIG. 9B is a cross-sectional view of the VTFET semiconductor device of FIG. 8B after additional fabrication operations and taken along the line Y2-Y2' of FIG. 3B, according to embodiments.
Figure 9C:
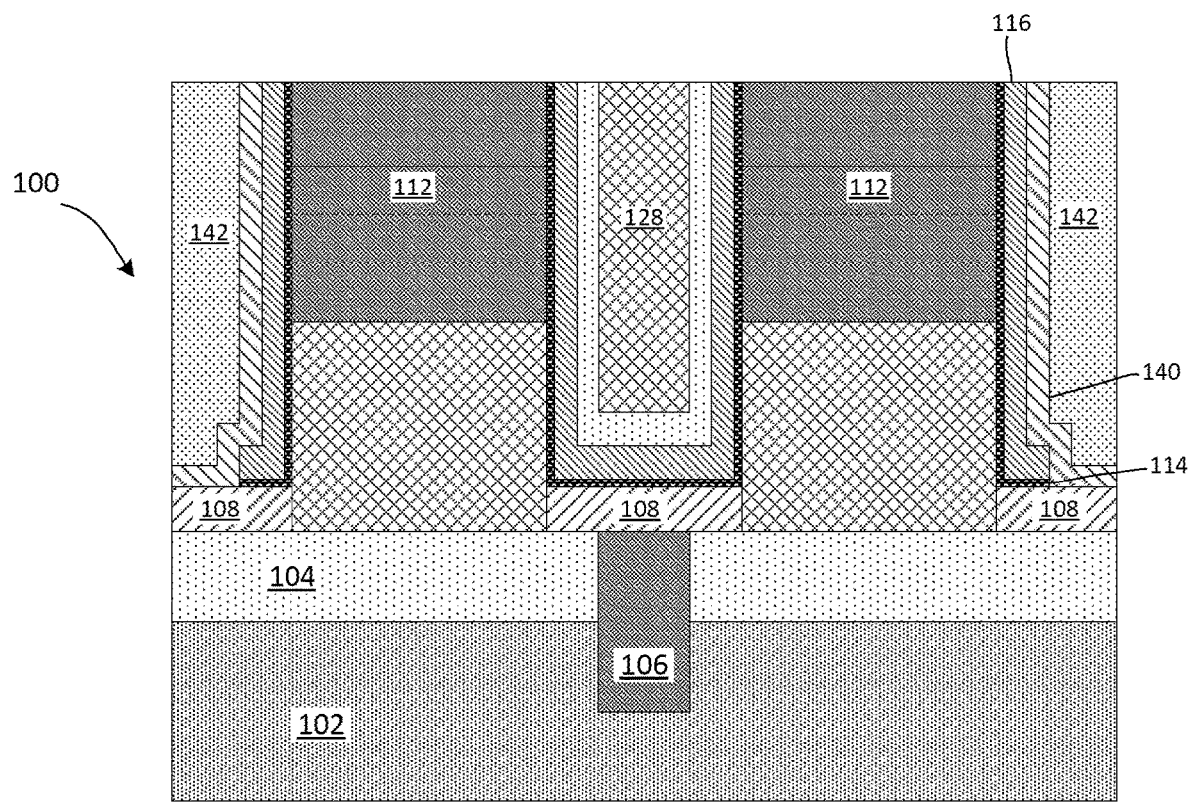
FIG. 9C is a cross-sectional view of the VTFET semiconductor device of FIG. 8C after additional fabrication operations and taken along the line Y1-Y1' of FIG. 3B, according to embodiments.

Referring now to FIG. 9A, this figure is a cross-sectional view of the VTFET semiconductor device 100 of FIG. 8A after additional fabrication operations and taken along the line X1-X1' of FIG. 3B, according to embodiments. As shown in FIGS. 9A-9C, a WFM encapsulation layer 140 (e.g., a SiN liner layer) is deposited over the entire VTFET semiconductor device 100. Thus, the WFM encapsulation layer 140 covers portions of the bottom spacer layer 108, and covers sidewalls of the WFM layer 116. Then, as shown in FIGS. 9A-9C, a second ILD layer 142 is deposited over the WFM encapsulation layer 140 up to at least the level of the top of the first ILD layer 128. In some embodiments, a planarization process, such as, chemical mechanical planarization (CMP) can be used to remove excess material of the second ILD layer 142 using fin hardmask 112 as a stopping point. In this example, a top surface of the first ILD 128 layer is coplanar with a top surface of the second ILD layer 142.

Figure 10A:
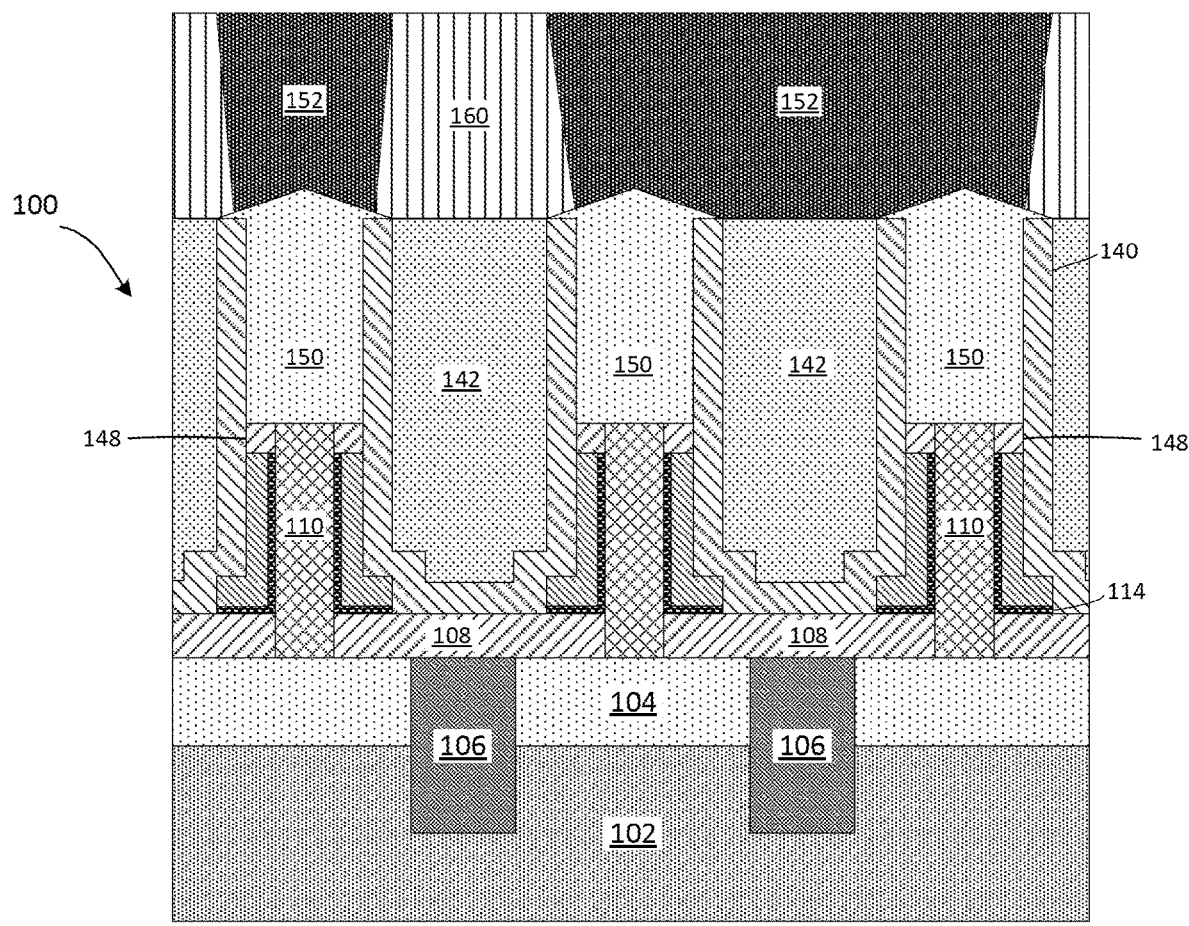
FIG. 10A is a cross-sectional view of the VTFET semiconductor device of FIG. 9A after additional fabrication operations and taken along the line X1-X1' of FIG. 10D, according to embodiments.
Figure 10B:
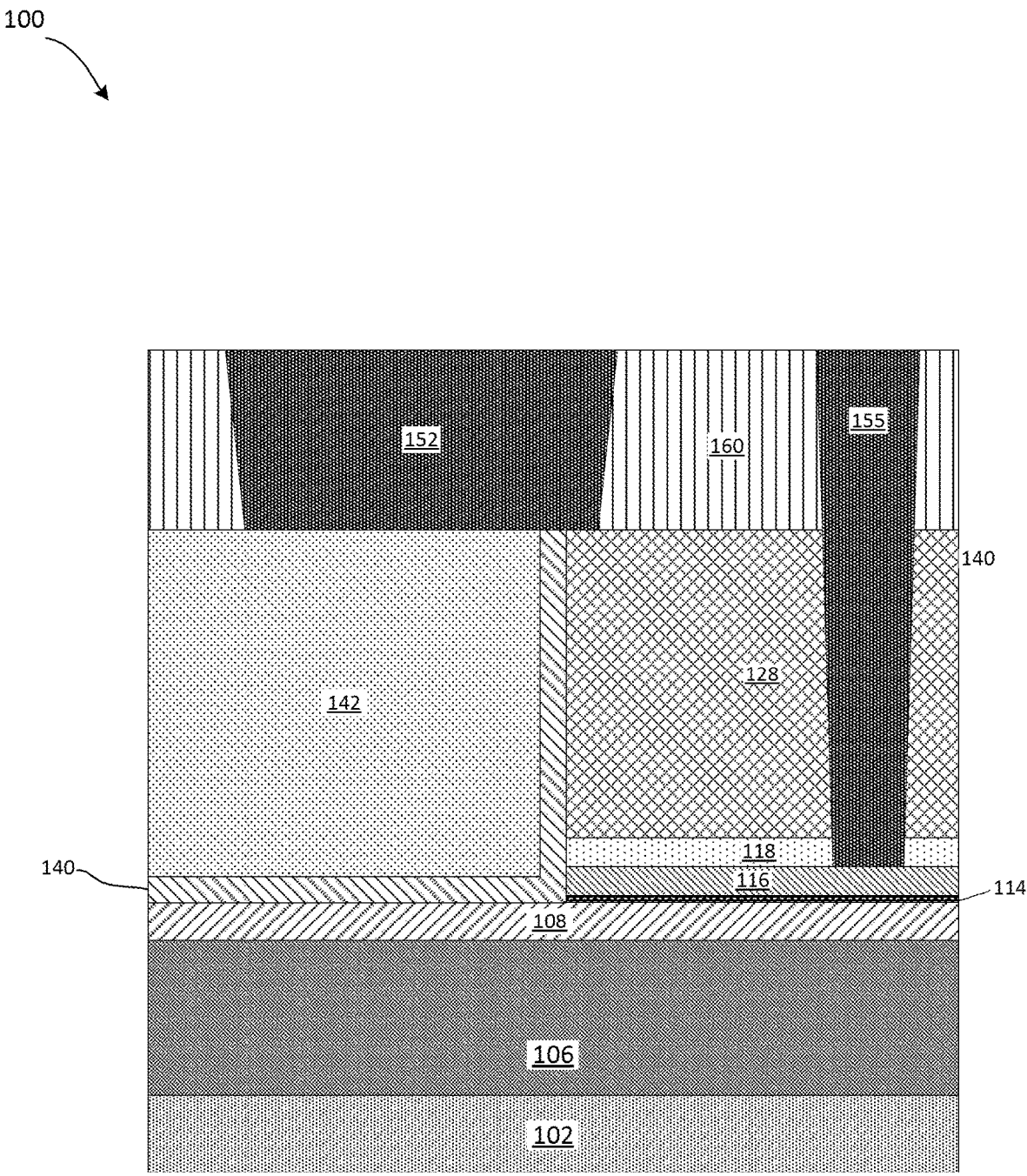
FIG. 10B is a cross-sectional view of the VTFET semiconductor device of FIG. 9B after additional fabrication operations and taken along the line Y2-Y2' of FIG. 10D, according to embodiments.
Figure 10C:
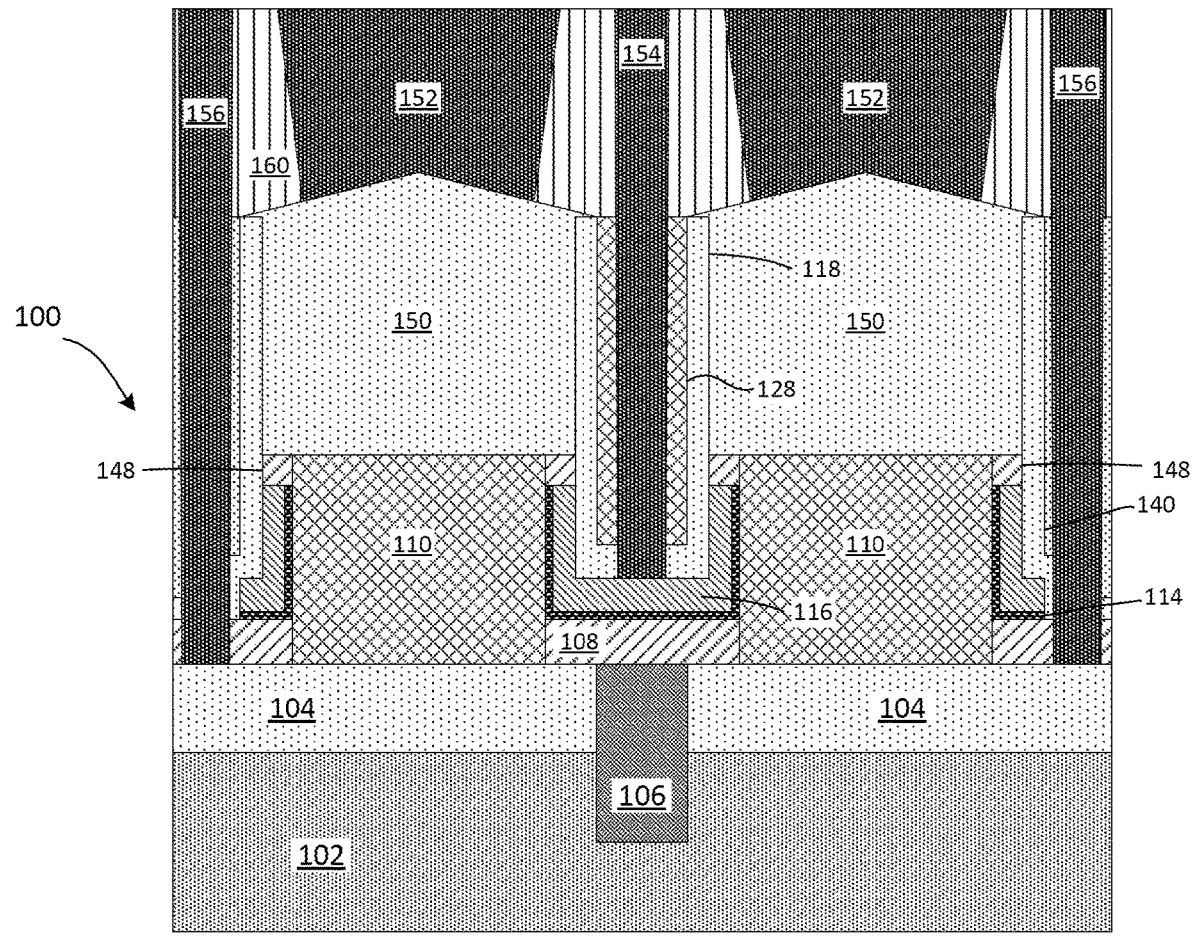
FIG. 10C is a cross-sectional view of the VTFET semiconductor device of FIG. 9C after additional fabrication operations and taken along the line Y1-Y1' of FIG. 10D, according to embodiments.

Referring now to FIG. 10A, this figure is a cross-sectional view of the VTFET semiconductor device 100 of FIG. 9A after additional fabrication operations and taken along the line X1-X1' of FIG. 3B, according to embodiments. As shown in FIGS. 10A-10C, several additional operations are performed to complete the structure of the VTFET semiconductor device 100. In certain embodiments, as shown in FIGS. 10A and 10C, the fin hardmasks 112 are completely removed, along with removal of the WFM layer 116 and the high-κ dielectric layer 114 down to a level that is below an upper surface of the fins 110. A top spacer layer 148 is formed in spaces between the WFM encapsulation layer 140 and the fins 110 up to a level that is about the same (or the same) as the upper surface of the fins 110. It should be appreciated that the material of the top spacer layer 148 may be the same as, or different from, the material of the bottom spacer layer 108. Then, a top epitaxial layer 150 (i.e., a top source/drain (S/D) epi) is epitaxially formed on the substrate fins 110 and between the WFM encapsulation layer 140. According to an embodiment, the top epitaxial layer 150 (or top source/drain regions) includes, if it is a pFET boron doped SiGe or Si (less preferred), or if it is an nFET phosphorus or arsenic doped silicon. However, it should be appreciated that other suitable materials may be used for the top epitaxial layer 150. In certain examples, the top epitaxial layer 150 may be formed to a height that is at or above the upper surface of the second ILD layer 142.

Figure 10D:
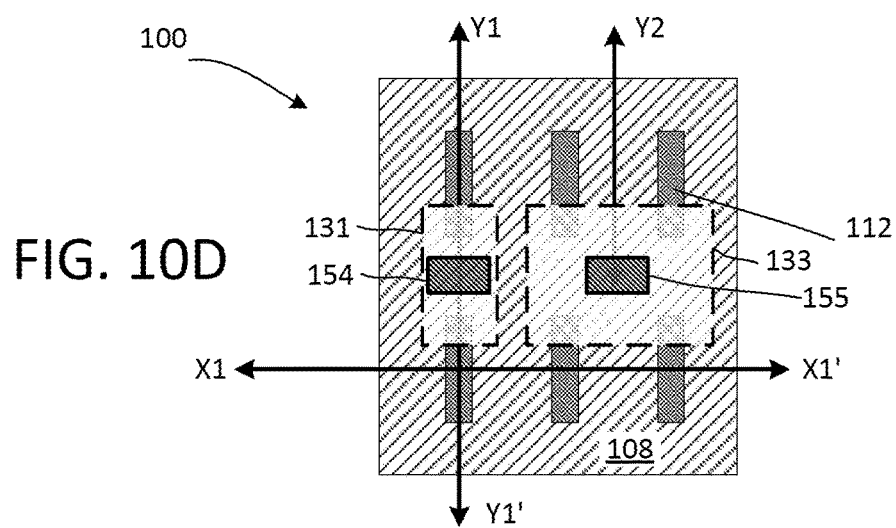
FIG. 10D is a top down view of the VTFET semiconductor device of FIG. 10A showing areas corresponding to the gate contacts, according to embodiments.

As shown in FIGS. 10A-10C, an upper ILD layer 160 is formed on the top epitaxial layer 150, and then various contacts are formed into the upper ILD layer 160. In some embodiments, a planarization process, such as, chemical mechanical planarization (CMP) can be used to remove excess material of the upper ILD layer 160 and the contacts. As shown in FIGS. 10B, 10C and the top down view of FIG. 10D, gate contacts 154 and 155 are formed through the upper ILD layer 160, through the first ILD layer 128, and through the WFM protecting layer 118 down to the level of the WFM layer 116 of the gate region. In certain embodiments, the gate contact 155 is shared among two NFET regions and two PFET regions, as shown in FIG. 10D. Also, the gate contact 154 is shared among one NFET region and one PFET region, as shown in FIG. 10D. However, it should be appreciated that this is merely one example of how the gate contacts may be shared among NFET and PFET regions, and other configurations are within the scope of the present embodiments. As also shown in FIGS. 10A-10C, second contacts 152 are formed that contact the top epitaxial layer 150, and third contacts 156 are formed that contact the bottom epitaxial layer 104.

As mentioned above, as the pitch of VTFET devices becomes smaller, and the aspect ratio of the device components become higher, there may be the potential for pattern collapse between the pillar components (e.g., the ILD layers) of adjacent VTFET devices. However, according to the present embodiments, the presence of the first ILD layer 128 and the second ILD layer 142 that are separated by the WFM encapsulation layer 140 provide a stable structure that may minimize or prevent pattern collapse between adjacent VTFET semiconductor devices.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a bottom epitaxial layer;
a gate stack formed over the bottom epitaxial layer, the gate stack including a work function metal (WFM) layer;
a channel fin formed on the bottom epitaxial layer;
a first interlayer dielectric (ILD) layer formed in a gate landing area over the gate stack;
a second ILD layer formed adjacent to the first ILD layer and outside the gate landing area; and
a WFM encapsulation layer formed between the first ILD layer and the second ILD layer, and formed on sidewalls of the gate stack.

2. The semiconductor device of claim 1, further comprising a top epitaxial layer formed on the channel fin.

3. The semiconductor device of claim 2, wherein the WFM encapsulation layer is also formed on sidewalls of the top epitaxial layer.

4. The semiconductor device of claim 1, wherein the semiconductor device is a vertical transport field effect transistor (VTFET).

5. The semiconductor device of claim 1, wherein a top surface of the first ILD layer is coplanar with a top surface of the second ILD layer.

6. The semiconductor device of claim 1, further comprising a bottom spacer layer formed between the gate stack and the bottom epitaxial layer.

7. The semiconductor device of claim 2, further comprising a top spacer layer formed between the gate stack and the top epitaxial layer.

8. The semiconductor device of claim 1, wherein the WFM encapsulation layer comprises SiN.

9. The semiconductor device of claim 1, wherein the gate stack includes:
a high-κ dielectric layer formed on a bottom spacer layer, the bottom spacer layer formed on the bottom epitaxial layer;
the WFM layer formed on the high-κ dielectric layer; and
a WFM protection layer formed on the WFM layer.

10. The semiconductor device of claim 9, wherein the WFM protection layer comprises SiN.

* * * * *